(12) United States Patent
Amin et al.

(10) Patent No.: US 11,562,798 B2
(45) Date of Patent: Jan. 24, 2023

(54) PROGRAMMING TECHNIQUES FOR MEMORY DEVICES HAVING PARTIAL DRAIN-SIDE SELECT GATES

(71) Applicant: SanDisk Technologies LLC, Addison, TX (US)

(72) Inventors: Parth Amin, Fremont, CA (US); Anubhav Khandelwal, San Jose, CA (US)

(73) Assignee: SanDisk Technologies LLC, Addison, CA (US)

( * ) Notice: Subject to any disclaimer, the term of this patent is extended or adjusted under 35 U.S.C. 154(b) by 42 days.

(21) Appl. No.: 17/348,261

(22) Filed: Jun. 15, 2021

(65) Prior Publication Data

US 2022/0399063 A1 Dec. 15, 2022

(51) Int. Cl.

| | |
|---|---|
| *G11C 11/56* | (2006.01) |
| *G11C 16/04* | (2006.01) |
| *G11C 16/10* | (2006.01) |
| *G11C 16/28* | (2006.01) |
| *G11C 16/34* | (2006.01) |
| *G11C 16/24* | (2006.01) |
| *G11C 16/30* | (2006.01) |
| *G11C 16/26* | (2006.01) |

(52) U.S. Cl.
CPC ...... *G11C 16/3459* (2013.01); *G11C 16/0433* (2013.01); *G11C 16/102* (2013.01); *G11C 16/24* (2013.01); *G11C 16/26* (2013.01); *G11C 16/30* (2013.01)

(58) Field of Classification Search
CPC ............ G11C 16/3459; G11C 16/0433; G11C 16/102; G11C 16/24; G11C 16/26; G11C 16/30
USPC ...................................................... 365/185.33
See application file for complete search history.

(56) References Cited

U.S. PATENT DOCUMENTS

| | | | |
|---|---|---|---|
| 8,867,271 B2 | 10/2014 | Li et al. | |
| 8,964,473 B2 | 2/2015 | Dong et al. | |
| 10,854,300 B2 | 12/2020 | Lu et al. | |
| 10,971,231 B1* | 4/2021 | Gautam | G11C 16/3427 |
| 2019/0378580 A1* | 12/2019 | Zhao | G11C 16/12 |
| 2019/0378581 A1* | 12/2019 | Zhao | G11C 16/10 |
| 2020/0035312 A1* | 1/2020 | Zhao | H01L 27/11582 |
| 2020/0365218 A1 | 11/2020 | Yang | |
| 2020/0388338 A1 | 12/2020 | Yang et al. | |

\* cited by examiner

*Primary Examiner* — Ly D Pham
(74) *Attorney, Agent, or Firm* — Dickinson Wright PLLC; Steven C. Hurles

(57) ABSTRACT

The programming techniques include the step of providing a memory device that includes a plurality of memory cells that are divided into at least two groups including a first group and a second group. The first group includes memory cells that are coupled to full select gate drains (SGDs), and the second group includes memory cells that are coupled to partial SGDs. The method continues with the step of applying a programming voltage to a selected word line that includes at least one memory cell of the first group and at least one memory cell of the second group. Simultaneous to the application of the programming voltage, the method continues with applying voltages to bit lines coupled to memory cells. The voltages being determined based on if the memory cells are of the first group or are of the second group.

20 Claims, 21 Drawing Sheets

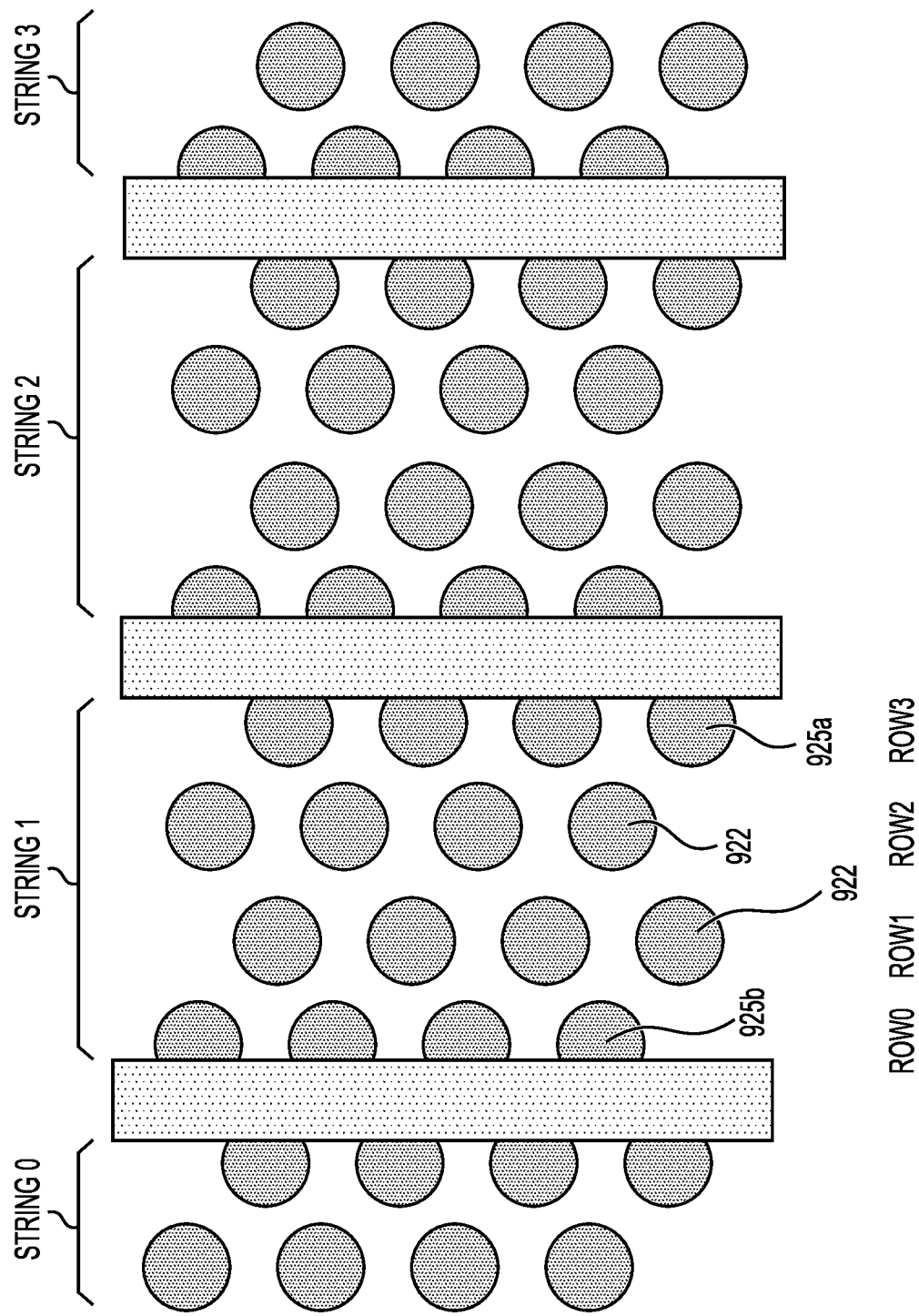

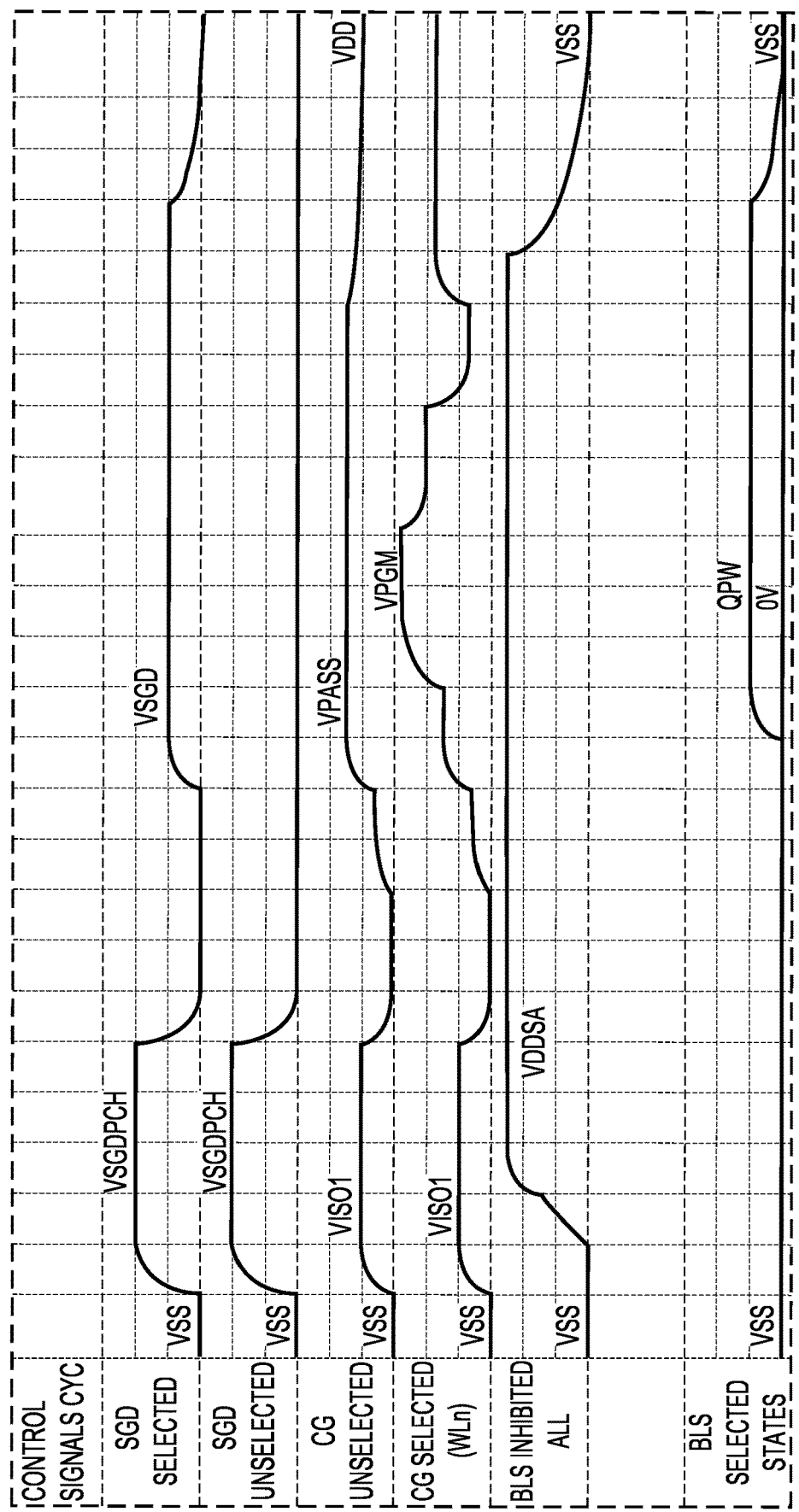

| STRING 1 | ROW 0 | ROW 1 | ROW 2 | ROW 3 |
|---|---|---|---|---|
| BIAS ON QPW BLS | VBLC_QPW + ΔVBLC_QPW1 | VBLC_QPW | VBLC_QPW | VBLC_QPW |
| BIAS ON INHIBIT BLS | VDDSA + ΔVDDSA1 | VDDSA | VDDSA | VDDSA |

*FIG. 14*

| STRING 1 | ROW 0 | ROW 1 | ROW 2 | ROW 3 |
|---|---|---|---|---|
| BIAS ON QPW BLS | VBLC_QPW + ΔVBLC_QPW1 | VBLC_QPW | VBLC_QPW | VBLC_QPW + ΔVBLC_QPW2 |
| BIAS ON INHIBIT BLS | VDDSA + ΔVDDSA1 | VDDSA | VDDSA | VDDSA + ΔVDDSA2 |

*FIG. 15*

| BLKS ZONE | STRING 1 | ROW 0 | ROW 1 | ROW 2 | ROW 3 |
|---|---|---|---|---|---|
| ZONE0 (FAR) | BIAS ON QPW BLS | VBLC_QPW + ΔVBLC_QPW1_ZONE0 | VBLC_QPW | VBLC_QPW | VBLC_QPW + ΔVBLC_QPW2_ZONE0 |
|  | BIAS ON INHIBIT BLS | VDDSA + ΔVDDSA1_ZONE0 | VDDSA | VDDSA | VDDSA + ΔVDDSA2_ZONE0 |
| ZONE1 (MIDDLE) | BIAS ON QPW BLS | VBLC_QPW + ΔVBLC_QPW1_ZONE1 | VBLC_QPW | VBLC_QPW | VBLC_QPW + ΔVBLC_QPW2_ZONE1 |
|  | BIAS ON INHIBIT BLS | VDDSA + ΔVDDSA1_ZONE1 | VDDSA | VDDSA | VDDSA + ΔVDDSA2_ZONE1 |
| ZONE2 (NEAR) | BIAS ON QPW BLS | VBLC_QPW + ΔVBLC_QPW1_ZONE2 | VBLC_QPW | VBLC_QPW | VBLC_QPW + ΔVBLC_QPW2_ZONE2 |
|  | BIAS ON INHIBIT BLS | VDDSA + ΔVDDSA1_ZONE2 | VDDSA | VDDSA | VDDSA + ΔVDDSA2_ZONE2 |

*FIG. 16*

| # LOOPS | 1 | 2 | 3 | 4 | 5 | 6 | 7 | 8 | 9 | 10 | 11 | 12 | 13 | 14 | 15 | READ |
|---|---|---|---|---|---|---|---|---|---|---|---|---|---|---|---|---|
| PROPOSAL FC | 0.15V | 0.15V | 0.15V | 0.15V | 0.15V | 0.15V | 0.15V | 0.15V | 0.15V | 0.15V | 0.15V | 0.15V | 0.15V | 0.15V | 0.15V | |
| PROPOSAL SC | 0.10V | 0.10V | 0.10V | 0.10V | 0.15V | 0.15V | 0.15V | 0.15V | 0.15V | 0.15V | 0.15V | 0.15V | 0.15V | 0.15V | 0.15V | |

*FIG. 19*

PROGRAMMING TECHNIQUES FOR MEMORY DEVICES HAVING PARTIAL DRAIN-SIDE SELECT GATES

TECHNICAL FIELD

This disclosure is related generally to non-volatile memory devices that have shallow etching features that cut through portions of drain-side select gates.

BACKGROUND

Many memory devices are provided as internal, semiconductor, integrated circuits in computers or other electronic devices. There are many different types of memory, including random-access memory (RAM), read only memory (ROM), dynamic random-access memory (DRAM), synchronous dynamic random-access memory (SDRAM), an electrically erasable programmable read-only memory (EEPROM), a flash memory, and/or the like. In an EEPROM or flash NAND array architecture, memory cells may be arranged in a matrix of rows and columns such that gates of each memory cell are coupled by rows to word lines. The memory cells may be arranged together in strings such that memory cells in a given string are coupled together in series, from source to drain, between a common source line and a common bit line.

In some NAND memory devices, a shallow etching features (SHE) partially cuts through portions of a plurality of memory holes that include memory cells and drain-side select gates (SGDs), thereby changing the programming characteristics of those memory cells.

SUMMARY

One aspect of the present disclosure is related to a method of programming a memory device. The method includes the step of providing a memory device that includes a plurality of memory cells that are divided into at least two groups including a first group and a second group. The first group includes memory cells that are coupled to full select gate drains (SGDs), and the second group includes memory cells that are coupled to partial SGDs. The method continues with the step of applying a programming voltage to a selected word line that includes at least one memory cell of the first group and at least one memory cell of the second group. Simultaneous to the application of the programming voltage, the method continues with applying voltages to bit lines coupled to memory cells. The voltages being determined based on if the memory cells are of the first group or are of the second group.

According to another aspect of the present disclosure, a voltage is applied to at least one of the bit lines coupled to one of the memory cells of the second group is equal to a voltage applied to at least one of the bit lines coupled to one of the memory cells of the first group plus a predetermined biasing voltage.

According to yet another aspect of the present disclosure, the selected word line includes at least one uninhibited memory cell of the first group, at least one uninhibited memory cell of the second group, at least one inhibited memory cell of the first group, and at least one inhibited memory cell of the second group. A voltage applied to the bit line coupled to the uninhibited memory cell of the first group is different than a voltage applied to the bit line coupled to the uninhibited memory cell of the second group, or a voltage applied to the bit line coupled to the inhibited memory cell of the first group is different than a voltage applied to the inhibited memory cell of the second group.

According to still another aspect of the present disclosure, both the voltage applied to the bit line coupled to the uninhibited memory cell of the first group is different than the voltage applied to the bit line coupled to the uninhibited memory cell of the second group and the voltage applied to the bit line coupled to the inhibited memory cell of the first group is different than the voltage applied to the inhibited memory cell of the second group.

According to a further aspect of the present disclosure, the memory device further includes a third group of memory cells that are coupled to partial select gate drains that are differently shaped than the partial select gate drains coupled to the memory cells of the second group.

According to yet a further aspect of the present disclosure, the selected word line includes at least one uninhibited memory cell of the third group and at least one inhibited memory cell of the third group. Simultaneous to applying the programming voltage, a different voltage is applied to at least one bit line coupled to the at least one uninhibited memory cell of the third group than the voltages that are applied to the bit lines coupled to the uninhibited memory cells of the first and second groups. Alternately or additionally, simultaneous to applying the programming voltage, a different voltage is applied to at least one bit line coupled to the at least one inhibited memory cell of the third group than the voltages that are applied to the bit lines coupled to the inhibited memory cells of the first and second groups.

According to still a further aspect of the present disclosure, the voltages applied to the bit lines coupled to memory cells of the first group are equal to the voltages applied to the bit lines coupled to memory cells of the second group plus a biasing voltage.

Another aspect of the present disclosure is related to a memory device that includes a plurality of memory cells including a first group of memory cells that are coupled to full select gate drains and a second group of memory cells that are coupled to partial select gate drains. The memory device further includes a controller that is configured to apply a programming voltage to a selected word line that includes at least one memory cell of the first group and at least one memory cell of the second group. Simultaneous to the application of the programming voltage, the controller is configured to apply voltages to bit lines coupled to the memory cells. The voltages are determined based on if the memory cells are of the first group or of the second group.

According to another aspect of the present disclosure, a voltage applied by the controller to at least one of the bit lines coupled to one of the memory cells of the second group is equal to a voltage applied by the controller to at least one of the bit lines coupled to the one of the memory cells of the first group plus a predetermined biasing voltage.

According to yet another aspect of the present disclosure, the selected word line includes at least one uninhibited memory cell of the first group, at least one uninhibited memory cell of the second group, at least one inhibited memory cell of the first group, and at least one inhibited memory cell of the second group. A voltage applied by the controller to the bit line coupled to the uninhibited memory cell of the first group is different than a voltage applied by the controller to the bit line coupled to the uninhibited memory cell of the second group or a voltage applied by the controller to the bit line coupled to the inhibited memory cell of the first group is different than a voltage applied by the controller to the inhibited memory cell of the second group.

According to still another aspect of the present disclosure, both the voltage applied by the controller to the bit line coupled to the uninhibited memory cell of the first group is different than the voltage applied by the controller to the bit line coupled to the uninhibited memory cell of the second group and the voltage applied by the controller to the bit line coupled to the inhibited memory cell of the first group is different than the voltage applied by the controller to the inhibited memory cell of the second group.

According a further aspect of the present disclosure, the memory device further includes a third group of memory cells that are coupled to partial select gate drains that are differently shaped than the partial select gate drains coupled to the memory cells of the second group.

According to yet a further aspect of the present disclosure, the selected word line includes at least one uninhibited memory cell of the third group and at least one inhibited memory cell of the third group. The controller is further configured to simultaneous to the application of the programming voltage, apply a different voltage to at least one bit line coupled to the at least one uninhibited memory cell of the third group than the voltages that are applied by the controller to the bit lines coupled to the uninhibited memory cells of the first and second groups. Alternately or additionally, simultaneous to the application of the programming voltage, apply a different voltage to at least one bit line coupled to the at least one inhibited memory cell of the third group than the voltages that are applied by the controller to the bit lines coupled to the inhibited memory cells of the first and second groups.

According to still a further aspect of the present disclosure, the voltages applied by the controller to the bit lines coupled to memory cells of the first group are equal to the voltages applied by the controller to the bit lines coupled to memory cells of the second group plus a biasing voltage.

Yet another aspect of the present disclosure is related to a memory device that includes a plurality of memory cells including a first group of memory cells that are coupled to full select gate drains and a second group of memory cells that are coupled to partial select gate drains. The memory device further includes a controller that is configured to perform a plurality of programming loops including verify operations. The controller is further configured to apply a first bit line voltage to a plurality of bit lines coupled to the memory cells of the second group during the verify operation of at least one first programming loop and to apply a second bit line voltage that is greater than the first bit line voltage to the plurality of bit lines coupled to the memory cells of the second group during the verify operation of at least one subsequent programming loop.

According to a further aspect of the present disclosure, the controller is further configured to apply the second bit line voltage to a plurality of bit lines that are coupled to the memory cells of the first group during the verify operations of the plurality of programming loops.

According to yet a further aspect of the present disclosure, the at least one first programming loop is no more than four programming loops.

According to still a further aspect of the present disclosure, the second bit line voltage is at least 0.05 V greater than the first bit line voltage.

According to another aspect of the present disclosure, the first bit line voltage is approximately 0.10 V and the second bit line voltage is approximately 0.15 V.

According to yet another aspect of the present disclosure, the partial select gate drains are semi-circular in shape.

BRIEF DESCRIPTION OF THE DRAWINGS

A more detailed description is set forth below with reference to example embodiments depicted in the appended figures. Understanding that these figures depict only example embodiments of the disclosure and are, therefore, not to be considered limiting of its scope. The disclosure is described and explained with added specificity and detail through the use of the accompanying drawings in which:

FIG. 9 depicts another top view of the exemplary word line layer of the exemplary stack of FIG. 8A;

FIG. 10 depicts the voltages that are applied to various components of the memory device during a programming operation of a programming loop;

FIG. 14 is an exemplary table depicting the QPW and VDDSA voltages that are applied to bit lines during programming or inhibit in an example memory device;

FIG. 15 is another exemplary table depicting the QPW and VDDSA voltages that are applied to bit lines during programming or inhibit in an example memory device;

FIG. 16 is yet another exemplary table depicting the QPW and VDDSA voltages that are applied to bit lines during programming or inhibit in an example memory device;

FIG. 19 depicts a table illustrating the bit line voltages that are applied to both the bit lines coupled to full-circle and semi-circle SGDs during verify operations of a plurality of programming loops;

DESCRIPTION OF THE ENABLING EMBODIMENTS

Programming techniques are taught herein to improve programming of memory blocks that include both full-circle and semi-circle SGDs (drain-side select gates).

As discussed in further detail below, according to a first aspect of the present disclosure, a programming technique is provided whereby the voltages that are applied to bit lines that are coupled to semi-circle SGDs are adjusted to achieve a similar VSGD window across different semi-circle SGD shapes. According to another aspect of the present disclosure, during verify, a bit line voltage that is applied to the bit lines that are coupled to the semi-circle SGDs is reduced only for the first couple of programming loops, thereby improving an upper tail of a Vt distribution of the memory cells coupled to those bit lines. These techniques improve performance and programming quality with little or no increase in programming time.

Figure 1A:
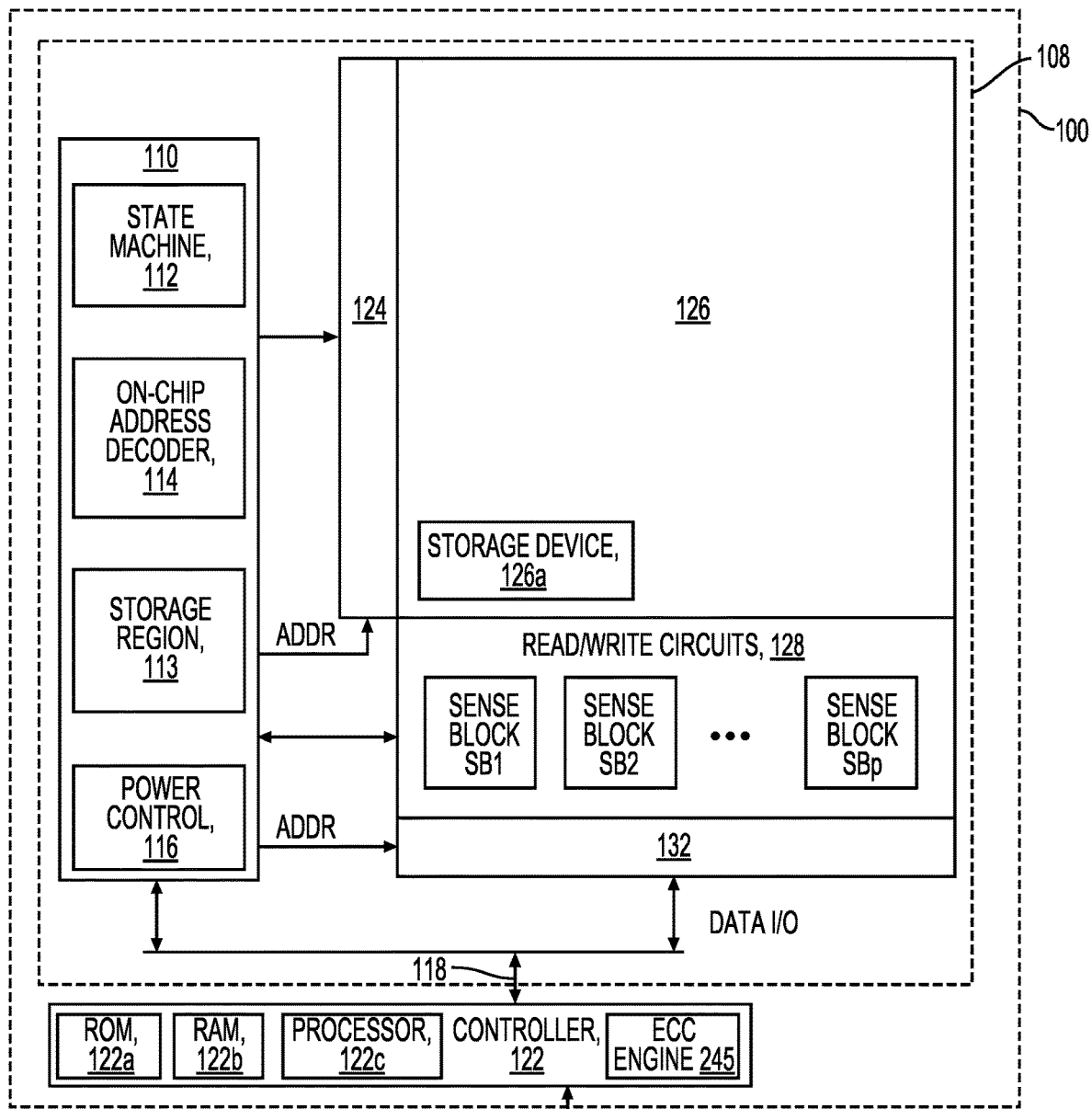
FIG. 1A is a block diagram of an example memory device.

FIG. 1A is a block diagram of an example memory device. The memory device 100 may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks SB1, SB2, . . . SBp (sensing circuitry) and allow a page of memory cells to be read or programmed in parallel. Typically, a controller 122 is included in the same memory device 100 (e.g., a removable storage card) as the one or more memory die 108. Commands and data are transferred between the host 140 and controller 122 via a data bus 120, and between the controller and the one or more memory die 108 via lines 118.

The memory structure 126 can be two-dimensional or three-dimensional. The memory structure 126 may comprise one or more array of memory cells including a three-dimensional array. The memory structure 126 may comprise a monolithic three-dimensional memory structure in which multiple memory levels are formed above (and not in) a single substrate, such as a wafer, with no intervening substrates. The memory structure 126 may comprise any type of non-volatile memory that is monolithically formed in one or more physical levels of arrays of memory cells having an active area disposed above a silicon substrate. The memory structure 126 may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, and a power control module 116. The state machine 112 provides chip-level control of memory operations.

A storage region 113 may, for example, be provided for programming parameters. The programming parameters may include a program voltage, a program voltage bias, position parameters indicating positions of memory cells, contact line connector thickness parameters, a verify voltage, and/or the like. The position parameters may indicate a position of a memory cell within the entire array of NAND strings, a position of a memory cell as being within a particular NAND string group, a position of a memory cell on a particular plane, and/or the like. The contact line connector thickness parameters may indicate a thickness of a contact line connector, a substrate or material that the contact line connector is comprised of, and/or the like.

The on-chip address decoder 114 provides an address interface between that used by the host or a memory controller to the hardware address used by the decoders 124 and 132. The power control module 116 controls the power and voltages supplied to the word lines and bit lines during memory operations. It can include drivers for word lines, SGS and SGD transistors, and source lines. The sense blocks can include bit line drivers, in one approach. An SGS transistor is a select gate transistor at a source end of a NAND string, and an SGD transistor is a select gate transistor at a drain end of a NAND string.

In some embodiments, some of the components can be combined. In various designs, one or more of the components (alone or in combination), other than memory structure 126, can be thought of as at least one control circuit which is configured to perform the actions described herein. For example, a control circuit may include any one of, or a combination of, control circuitry 110, state machine 112, decoders 114/132, power control module 116, sense blocks SBb, SB2, . . . , SBp, read/write circuits 128, controller 122, and so forth.

The control circuits can include a programming circuit configured to perform a program and verify operation for one set of memory cells, wherein the one set of memory cells comprises memory cells assigned to represent one data state among a plurality of data states and memory cells assigned to represent another data state among the plurality of data states; the program and verify operation comprising a plurality of program and verify iterations; and in each program and verify iteration, the programming circuit performs programming for the one word line after which the programming circuit applies a verification signal to the one word line. The control circuits can also include a counting circuit configured to obtain a count of memory cells which pass a verify test for the one data state. The control circuits can also include a determination circuit configured to determine, based on an amount by which the count exceeds a threshold, a particular program and verify iteration among the plurality of program and verify iterations in which to perform a verify test for another data state for the memory cells assigned to represent another data state.

Figure 1B:
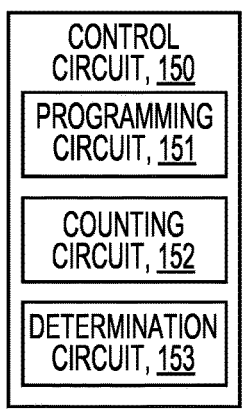
FIG. 1B is a block diagram of an example control circuit.

For example, FIG. 1B is a block diagram of an example control circuit 150 which comprises a programming circuit 151, a counting circuit 152, and a determination circuit 153.

The off-chip controller 122 may comprise a processor 122c, storage devices (memory) such as ROM 122a and RAM 122b and an error-correction code (ECC) engine 245. The ECC engine can correct a number of read errors which are caused when the upper tail of a Vth distribution becomes too high. However, uncorrectable errors may exist in some cases. The techniques provided herein reduce the likelihood of uncorrectable errors.

The storage device(s) 122a, 122b comprise, code such as a set of instructions, and the processor 122c is operable to execute the set of instructions to provide the functionality described herein. Alternately or additionally, the processor 122c can access code from a storage device 126a of the memory structure 126, such as a reserved area of memory cells in one or more word lines. For example, code can be used by the controller 122 to access the memory structure 126 such as for programming, read and erase operations. The code can include boot code and control code (e.g., set of instructions). The boot code is software that initializes the controller 122 during a booting or startup process and enables the controller 122 to access the memory structure 126. The code can be used by the controller 122 to control one or more memory structures 126. Upon being powered up, the processor 122c fetches the boot code from the ROM 122a or storage device 126a for execution, and the boot code initializes the system components and loads the control code into the RAM 122b. Once the control code is loaded into the RAM 122b, it is executed by the processor 122c. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below and provide the voltage waveforms including those discussed further below.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple memory strings in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured. The semiconductor memory elements located within and/or over a substrate may be arranged in two or three dimensions, such as a two-dimensional memory structure or a three-dimensional memory structure.

In a two-dimensional memory structure, the semiconductor memory elements are arranged in a single plane or a single memory device level. Typically, in a two-dimensional memory structure, memory elements are arranged in a plane (e.g., in an x-y direction plane) which extends substantially parallel to a major surface of a substrate that supports the memory elements. The substrate may be a wafer over or in which the layer of the memory elements is formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three-dimensional memory array is arranged so that memory elements occupy multiple planes or multiple memory device levels, thereby forming a structure in three dimensions (i.e., in the x, y and z directions, where the z-direction is substantially perpendicular and the x- and y-directions are substantially parallel to the major surface of the substrate).

As a non-limiting example, a three-dimensional memory structure may be vertically arranged as a stack of multiple two-dimensional memory device levels. As another non-limiting example, a three-dimensional memory array may be arranged as multiple vertical columns (e.g., columns extending substantially perpendicular to the major surface of the substrate, i.e., in the y direction) with each column having multiple memory elements. The columns may be arranged in a two-dimensional configuration, e.g., in an x-y plane, resulting in a three-dimensional arrangement of memory elements with elements on multiple vertically stacked memory planes. Other configurations of memory elements in three dimensions can also constitute a three-dimensional memory array.

By way of non-limiting example, in a three-dimensional array of NAND strings, the memory elements may be coupled together to form a NAND string within a single horizontal (e.g., x-y) memory device level. Alternatively, the memory elements may be coupled together to form a vertical NAND string that traverses across multiple horizontal memory device levels. Other three-dimensional configurations can be envisioned wherein some NAND strings contain memory elements in a single memory level while other strings contain memory elements which span through multiple memory levels. Three-dimensional memory arrays may also be designed in a NOR configuration and in a ReRAM configuration.

Typically, in a monolithic three-dimensional memory array, one or more memory device levels are formed above a single substrate. Optionally, the monolithic three-dimensional memory array may also have one or more memory layers at least partially within the single substrate. As a non-limiting example, the substrate may include a semiconductor such as silicon. In a monolithic three-dimensional array, the layers constituting each memory device level of the array are typically formed on the layers of the underlying memory device levels of the array. However, layers of adjacent memory device levels of a monolithic three-dimensional memory array may be shared or have intervening layers between memory device levels.

Then again, two-dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three-dimensional memory arrays. Further, multiple two-dimensional memory arrays or three-dimensional memory arrays (monolithic or non-monolithic) may be formed on separate chips and then packaged together to form a stacked-chip memory device.

Figure 2:
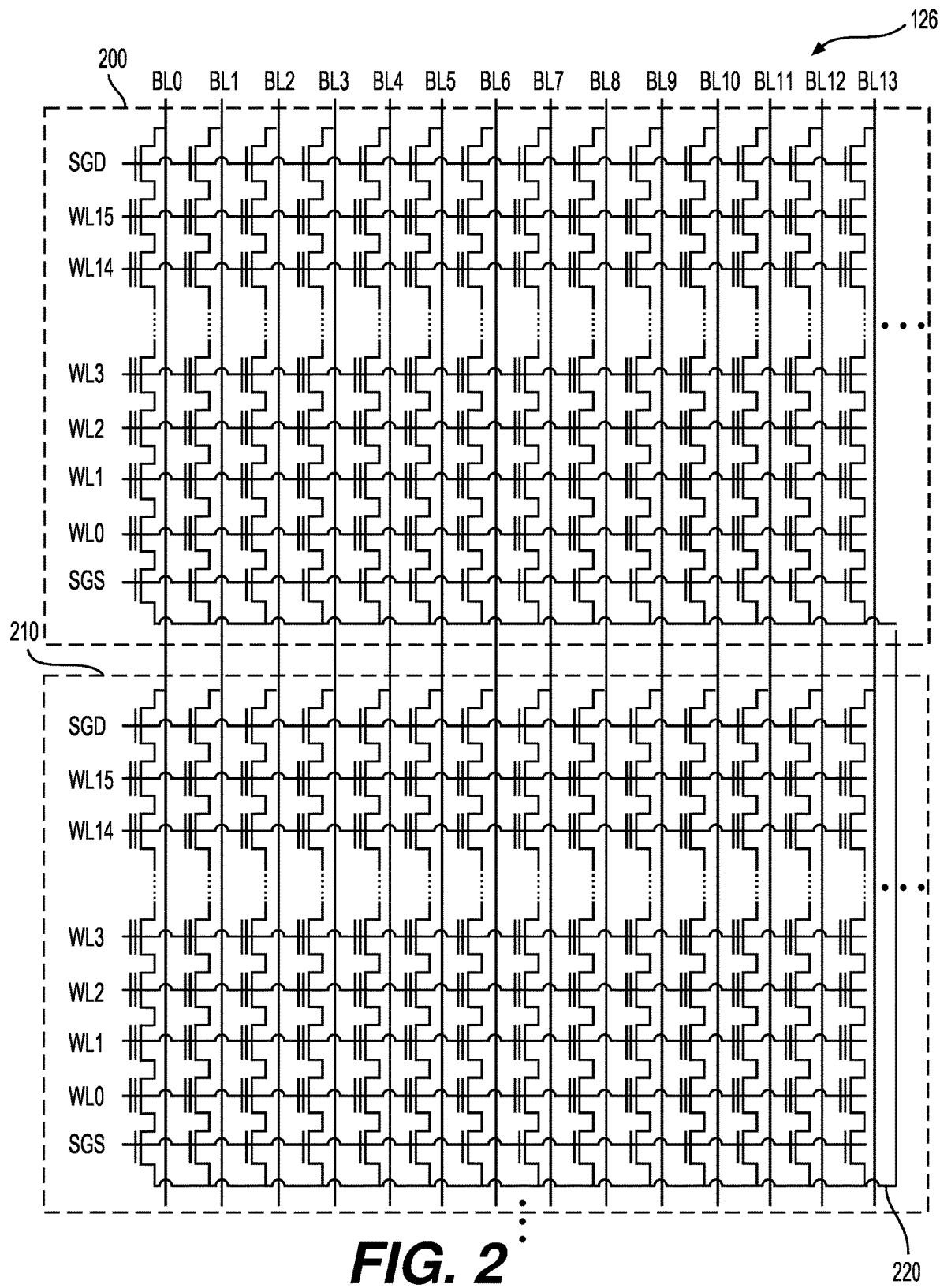
FIG. 2 depicts blocks of memory cells in an example two-dimensional configuration of the memory array of FIG. 1A.

FIG. 2 illustrates schematic views of three types of memory architectures utilizing staggered memory strings. For example, reference number 201 shows a schematic view of a first example memory architecture, reference number 203 shows a schematic view of a second example memory architecture, and reference number 205 shows a schematic view of a third example memory architecture. In some embodiments, as shown, the memory architecture may include an array of staggered NAND strings.

FIG. 2 illustrates blocks 200, 210 of memory cells in an example two-dimensional configuration of the memory array 126 of FIG. 1. The memory array 126 can include many such blocks 200, 210. Each example block 200, 210 includes a number of NAND strings and respective bit lines, e.g., BL0, BL1, ... which are shared among the blocks. Each NAND string is connected at one end to an SGD, and the control gates of the drain select gates are connected via a common SGD line. The NAND strings are connected at their other end to a source-side select gate (SGS) which, in turn, is connected to a common source line 220. Sixteen word lines, for example, WL0-WL15, extend between the SGSs and the SGDs. In some cases, dummy word lines, which contain no user data, can also be used in the memory array adjacent to the select gate transistors. Such dummy word lines can shield the edge data word line from certain edge effects.

Figure 3A:
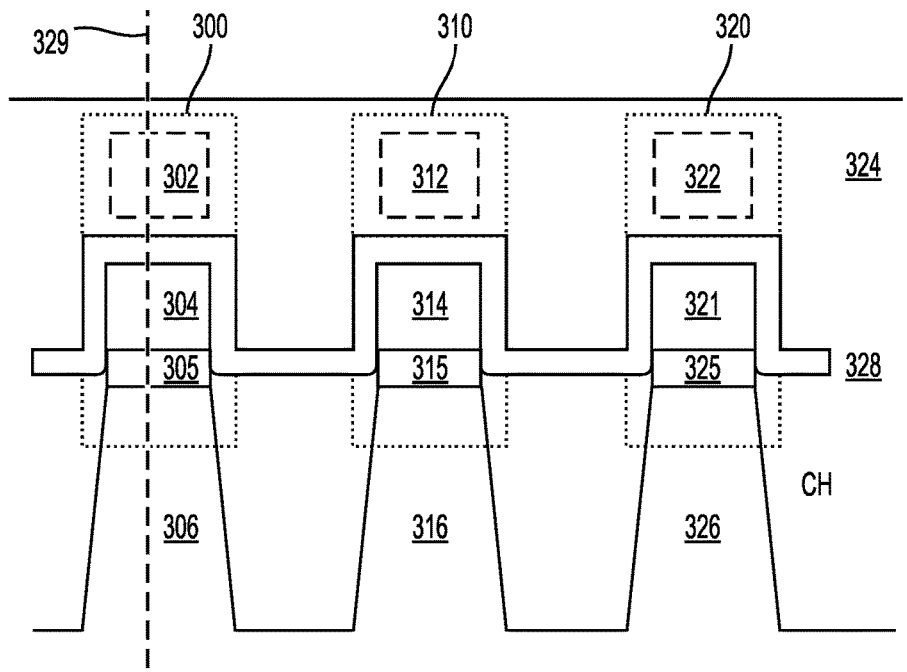
FIG. 3A and FIG. 3B depict cross-sectional views of example floating gate memory cells in NAND strings.
Figure 3B:
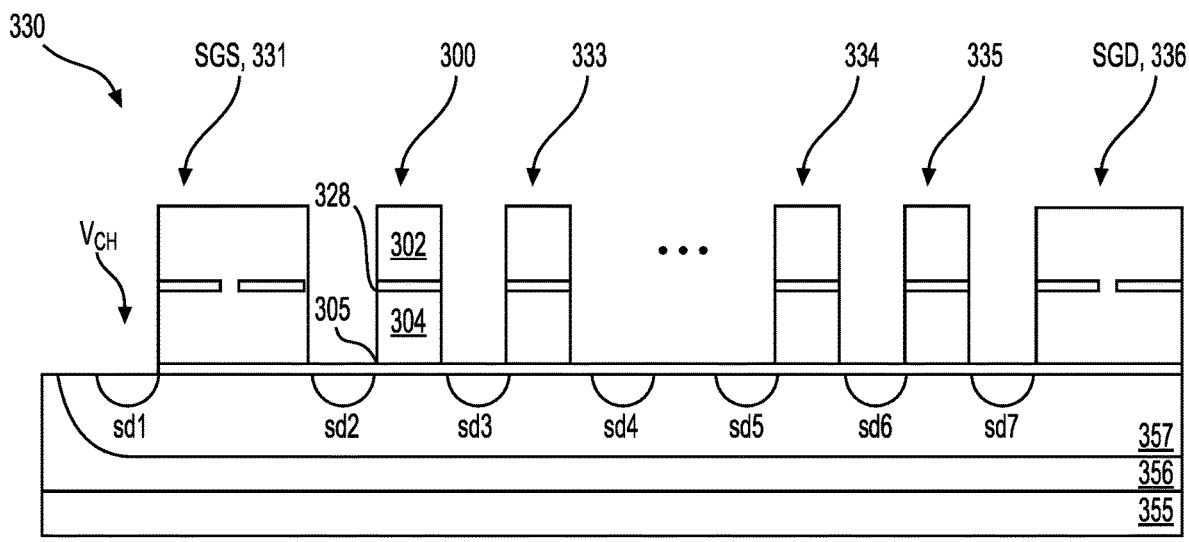

One type of non-volatile memory which may be provided in the memory array is a floating gate memory, such as of the type shown in FIGS. 3A and 3B. However, other types of non-volatile memory can also be used. As discussed in further detail below, in another example shown in FIGS. 4A and 4B, a charge-trapping memory cell uses a non-conductive dielectric material in place of a conductive floating gate to store charge in a non-volatile manner. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor.

In another approach, NROM cells are used. Two bits, for example, are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric. Other types of non-volatile memory are also known.

FIG. 3A illustrates a cross-sectional view of example floating gate memory cells 300, 310, 320 in NAND strings. In this Figure, a bit line or NAND string direction goes into the page, and a word line direction goes from left to right. As an example, word line 324 extends across NAND strings which include respective channel regions 306, 316 and 326. The memory cell 300 includes a control gate 302, a floating gate 304, a tunnel oxide layer 305 and the channel region 306. The memory cell 310 includes a control gate 312, a floating gate 314, a tunnel oxide layer 315 and the channel region 316. The memory cell 320 includes a control gate 322, a floating gate 321, a tunnel oxide layer 325 and the channel region 326. Each memory cell 300, 310, 320 is in a different respective NAND string. An inter-poly dielectric (IPD) layer 328 is also illustrated. The control gates 302, 312, 322 are portions of the word line. A cross-sectional view along contact line connector 329 is provided in FIG. 3B.

The control gate 302, 312, 322 wraps around the floating gate 304, 314, 321, increasing the surface contact area between the control gate 302, 312, 322 and floating gate 304, 314, 321. This results in higher IPD capacitance, leading to a higher coupling ratio which makes programming and erase easier. However, as NAND memory devices are scaled down, the spacing between neighboring cells 300, 310, 320 becomes smaller so there is almost no space for the control gate 302, 312, 322 and the IPD layer 328 between two adjacent floating gates 302, 312, 322.

Figure 4A:
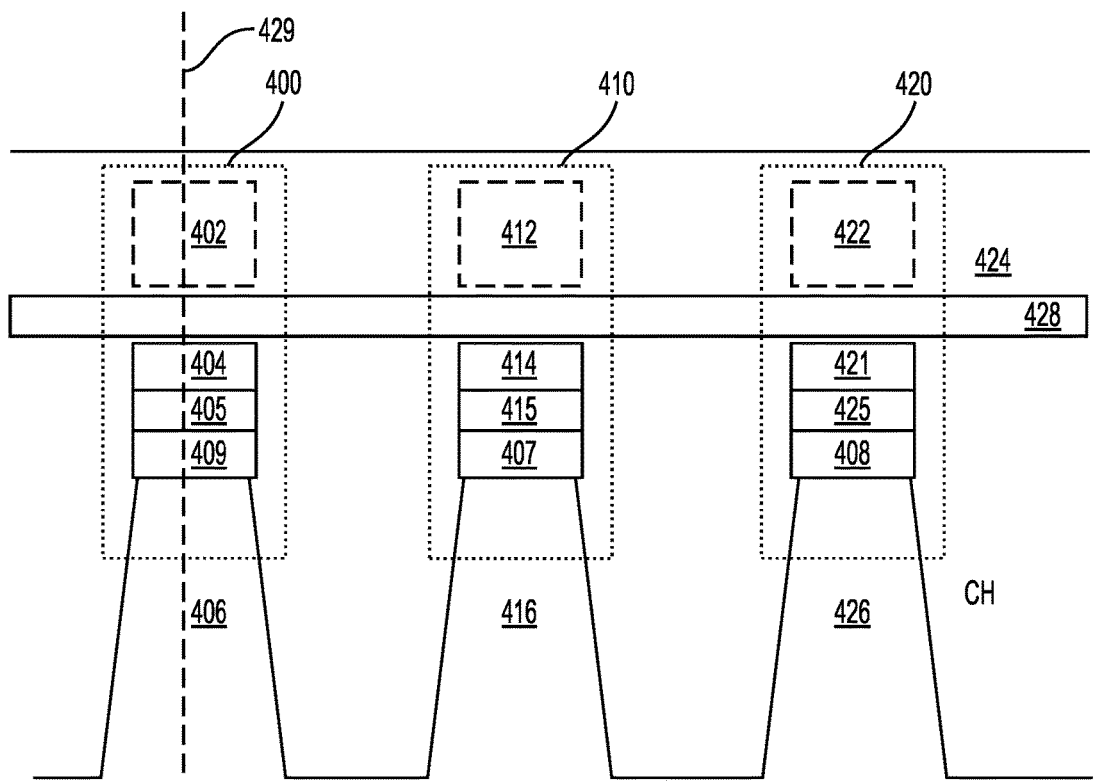
FIG. 4A and FIG. 4B depict cross-sectional views of example charge-trapping memory cells in NAND strings.
Figure 4B:
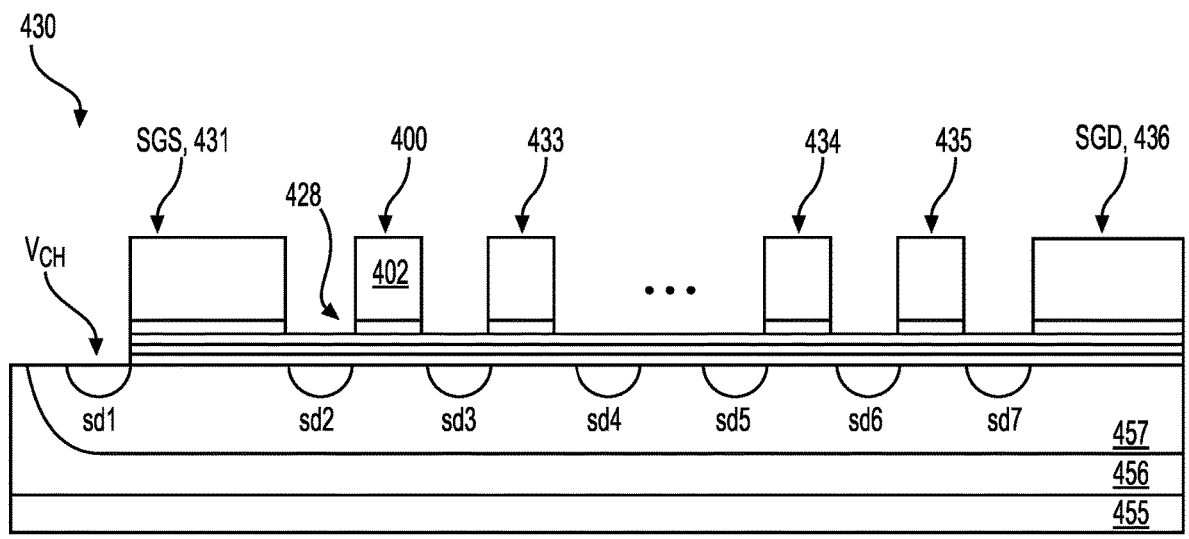

As an alternative, as shown in FIGS. 4A and 4B, the flat or planar memory cell 400, 410, 420 has been developed in which the control gate 402, 412, 422 is flat or planar; that is, it does not wrap around the floating gate and its only contact with the charge storage layer 428 is from above it. In this case, there is no advantage in having a tall floating gate. Instead, the floating gate is made much thinner. Further, the floating gate can be used to store charge, or a thin charge trap layer can be used to trap charge. This approach can avoid the issue of ballistic electron transport, where an electron travel through the floating gate after tunneling through the tunnel oxide during programming.

FIG. 4A depicts a cross-sectional view of example charge-trapping memory cells 400, 410, 420 in NAND strings. The view is in a word line direction of memory cells 400, 410, 420 comprising a flat control gate and charge-trapping regions as a two-dimensional example of memory cells 400, 410, 420 in the memory cell array 126 of FIG. 1. Charge-trapping memory can be used in NOR and NAND flash memory device. This technology uses an insulator such as an SiN film to store electrons, in contrast to a floating-gate MOSFET technology which uses a conductor such as doped polycrystalline silicon to store electrons. As an example, a word line 424 extends across NAND strings which include respective channel regions 406, 416, 426. Portions of the word line provide control gates 402, 412, 422. Below the word line is an IPD layer 428, charge-trapping layers 404, 414, 421, polysilicon layers 405, 415, 425, and tunneling layers 409, 407, 408. Each charge-trapping layer 404, 414, 421 extends continuously in a respective NAND string. The flat configuration of the control gate can be made thinner than a floating gate. Additionally, the memory cells can be placed closer together.

FIG. 4B illustrates a cross-sectional view of the structure of FIG. 4A along contact line connector 429. The NAND string 430 includes an SGS transistor 431, example memory cells 400, 433, . . . 435, and an SGD transistor 436. Passageways in the IPD layer 428 in the SGS and SGD transistors 431, 436 allow the control gate layers 402 and floating gate layers to communicate. The control gate 402 and floating gate layers may be polysilicon and the tunnel oxide layer may be silicon oxide, for instance. The IPD layer 428 can be a stack of nitrides (N) and oxides (0) such as in a N—O—N—O—N configuration.

The NAND string may be formed on a substrate which comprises a p-type substrate region 455, an n-type well 456 and a p-type well 457. N-type source/drain diffusion regions sd1, sd2, sd3, sd4, sd5, sd6 and sd7 are formed in the p-type well. A channel voltage, Vch, may be applied directly to the channel region of the substrate.

Figure 5:
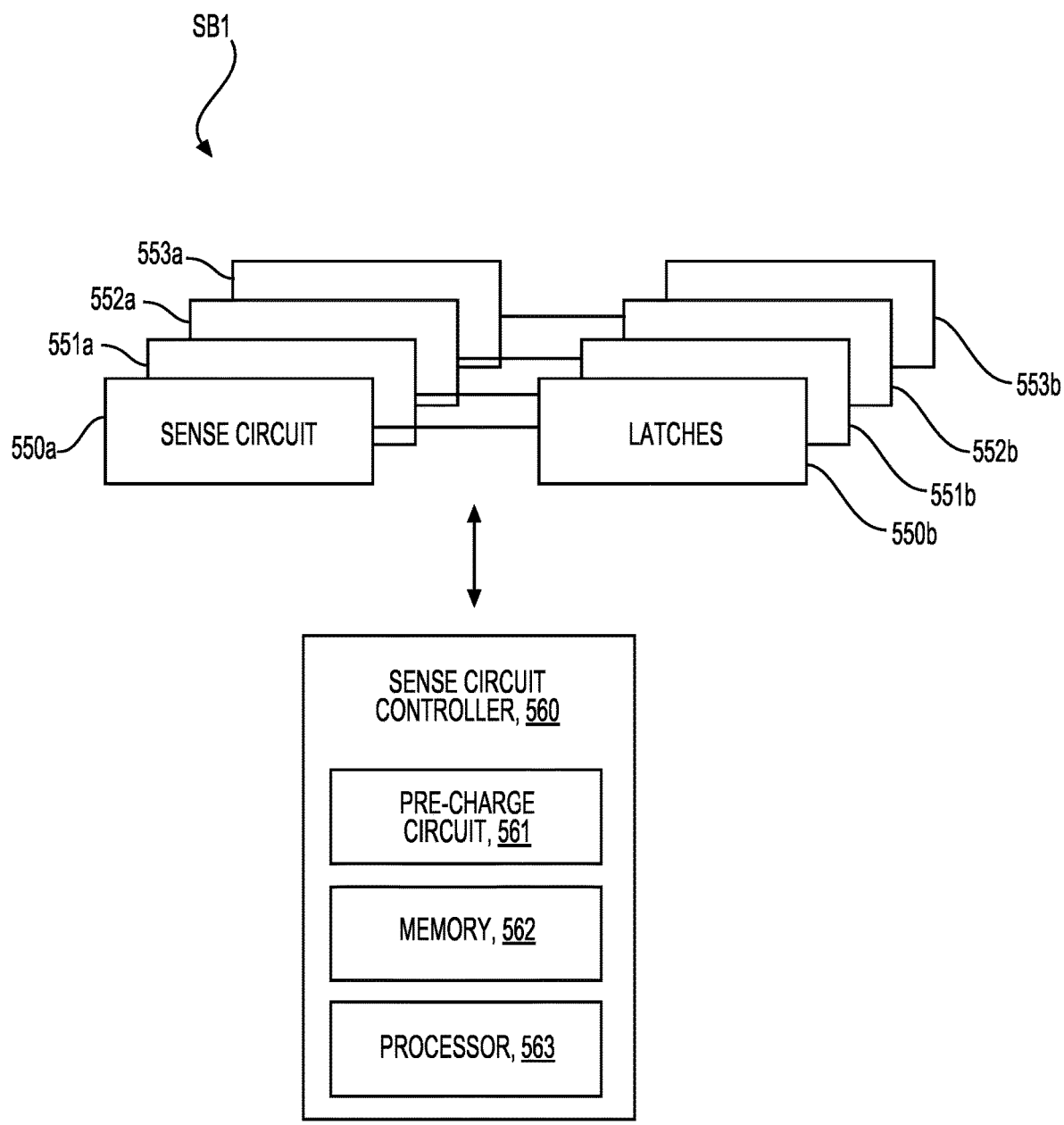
FIG. 5 depicts an example block diagram of the sense block SB1 of FIG. 1.

FIG. 5 illustrates an example block diagram of the sense block SB1 of FIG. 1. In one approach, a sense block comprises multiple sense circuits. Each sense circuit is associated with data latches. For example, the example sense circuits 550a, 551a, 552a, and 553a are associated with the data latches 550b, 551b, 552b, and 553b, respectively. In one approach, different subsets of bit lines can be sensed using different respective sense blocks. This allows the processing load which is associated with the sense circuits to be divided up and handled by a respective processor in each sense block. For example, a sense circuit controller 560 in SB1 can communicate with the set of sense circuits and latches. The sense circuit controller 560 may include a pre-charge circuit 561 which provides a voltage to each sense circuit for setting a pre-charge voltage. In one possible approach, the voltage is provided to each sense circuit independently, e.g., via the data bus and a local bus. In another possible approach, a common voltage is provided to each sense circuit concurrently. The sense circuit controller 560 may also include a pre-charge circuit 561, a memory 562 and a processor 563. The memory 562 may store code which is executable by the processor to perform the functions described herein. These functions can include reading the latches 550b, 551b, 552b, 553b which are associated with the sense circuits 550a, 551a, 552a, 553a, setting bit values in the latches and providing voltages for setting pre-charge levels in sense nodes of the sense circuits 550a, 551a, 552a, 553a. Further example details of the sense circuit controller 560 and the sense circuits 550a, 551a, 552a, 553a are provided below.

In some embodiments, a memory cell may include a flag register that includes a set of latches storing flag bits. In some embodiments, a quantity of flag registers may correspond to a quantity of data states. In some embodiments, one or more flag registers may be used to control a type of verification technique used when verifying memory cells. In some embodiments, a flag bit's output may modify associated logic of the device, e.g., address decoding circuitry, such that a specified block of cells is selected. A bulk operation (e.g., an erase operation, etc.) may be carried out using the flags set in the flag register, or a combination of the flag register with the address register, as in implied addressing, or alternatively by straight addressing with the address register alone.

Figure 6A:
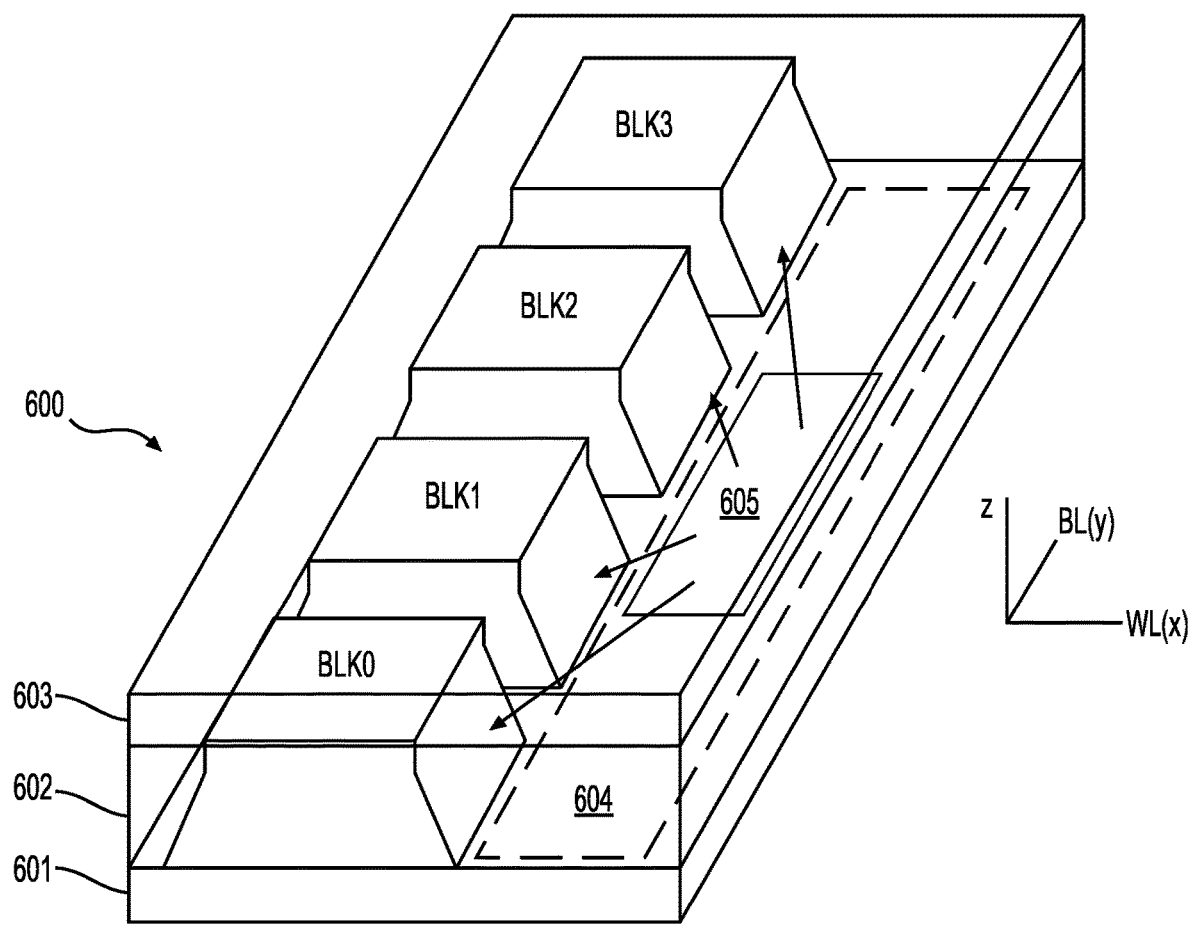
FIG. 6A is a perspective view of a set of blocks in an example three-dimensional configuration of the memory array of FIG. 1.

FIG. 6A is a perspective view of a set of blocks 600 in an example three-dimensional configuration of the memory array 126 of FIG. 1. On the substrate are example blocks BLK0, BLK1, BLK2, BLK3 of memory cells (storage elements) and a peripheral area 604 with circuitry for use by the blocks BLK0, BLK1, BLK2, BLK3. For example, the circuitry can include voltage drivers 605 which can be connected to control gate layers of the blocks BLK0, BLK1, BLK2, BLK3. In one approach, control gate layers at a common height in the blocks BLK0, BLK1, BLK2, BLK3 are commonly driven. The substrate 601 can also carry circuitry under the blocks BLK0, BLK1, BLK2, BLK3, along with one or more lower metal layers which are patterned in conductive paths to carry signals of the circuitry. The blocks BLK0, BLK1, BLK2, BLK3 are formed in an intermediate region 602 of the memory device. In an upper region 603 of the memory device, one or more upper metal layers are patterned in conductive paths to carry signals of the circuitry. Each block BLK0, BLK1, BLK2, BLK3 comprises a stacked area of memory cells, where alternating levels of the stack represent word lines. In one possible approach, each block BLK0, BLK1, BLK2, BLK3 has opposing tiered sides from which vertical contacts extend upward to an upper metal layer to form connections to conductive paths. While four blocks BLK0, BLK1, BLK2, BLK3 are illustrated as an example, two or more blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 6B:
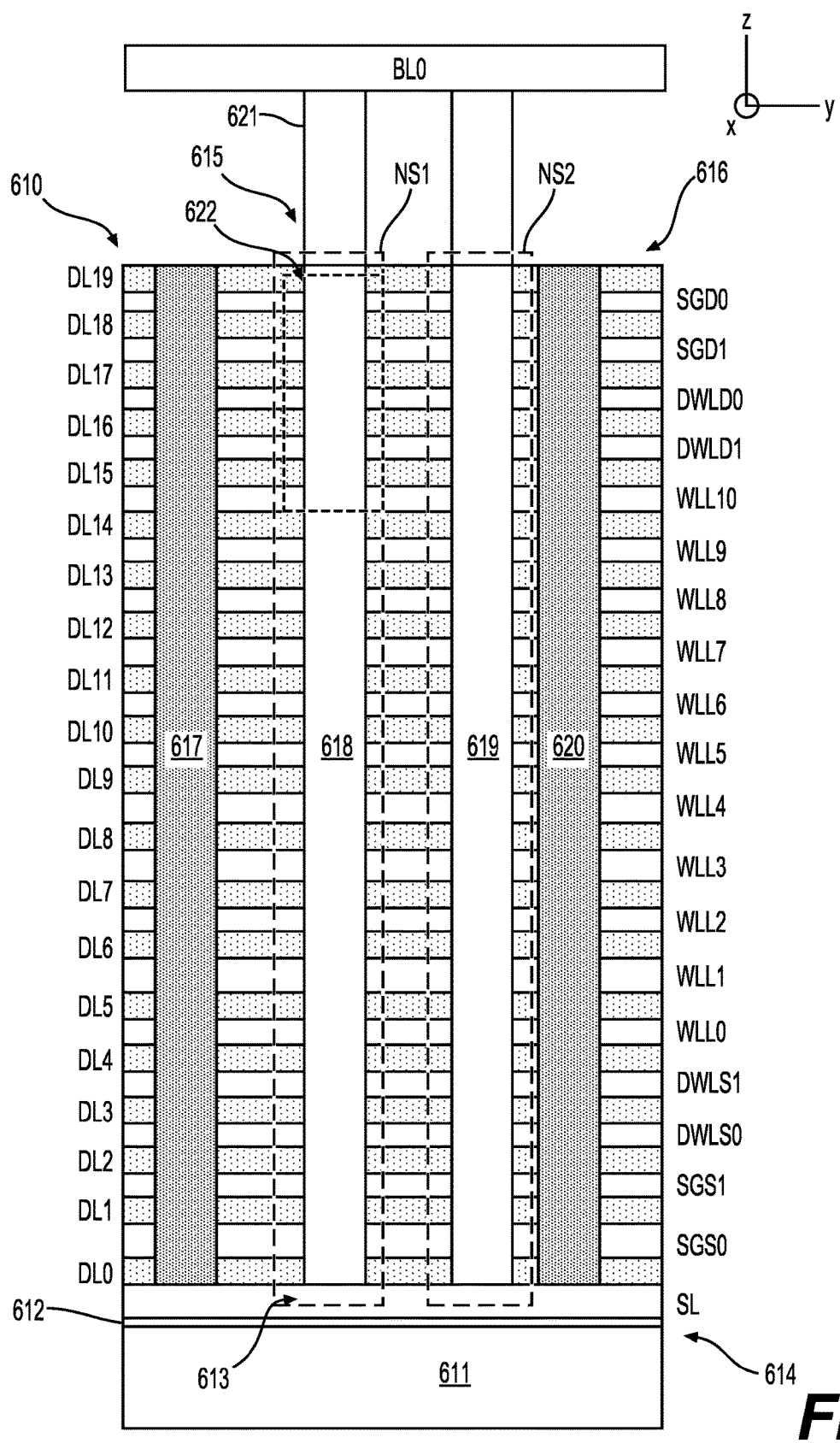
FIG. 6B depicts an example cross-sectional view of a portion of one of the blocks of FIG. 6A.

FIG. 6B illustrates an example cross-sectional view of a portion of one of the blocks BLK0, BLK1, BLK2, BLK3 of FIG. 6A. The block comprises a stack 610 of alternating conductive and dielectric layers. In this example, the conductive layers comprise two SGD layers, two SGS layers and four dummy word line layers DWLD0, DWLD1, DWLS0 and DWLS1, in addition to data word line layers (word lines) WLL0-WLL10. The dielectric layers are labelled as DL0-DL19. Further, regions of the stack 610 which comprise NAND strings NS1 and NS2 are illustrated. Each NAND string encompasses a memory hole 618, 619 which is filled with materials which form memory cells adjacent to the word lines. A region 622 of the stack 610 is shown in greater detail in FIG. 6D and is discussed in further detail below.

The 610 stack includes a substrate 611, an insulating film 612 on the substrate 611, and a portion of a source line SL. NS1 has a source-end 613 at a bottom 614 of the stack and a drain-end 615 at a top 616 of the stack 610. Contact line connectors (e.g., slits, such as metal-filled slits) 617, 620 may be provided periodically across the stack 610 as interconnects which extend through the stack 610, such as to connect the source line to a particular contact line above the stack 610. The contact line connectors 617, 620 may be used during the formation of the word lines and subsequently filled with metal. A portion of a bit line BL0 is also illustrated. A conductive via 621 connects the drain-end 615 to BL0.

Figure 6C:
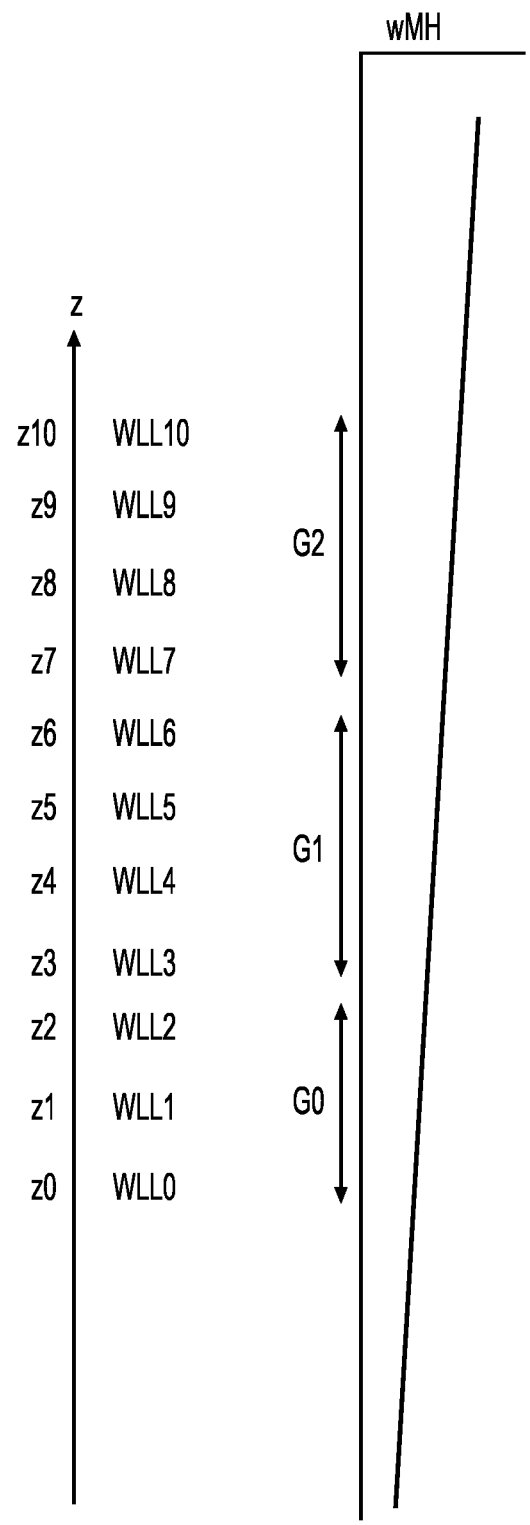
FIG. 6C depicts a plot of memory hole diameter in the stack of FIG. 6B.

FIG. 6C illustrates a plot of memory hole diameter in the stack of FIG. 6B. The vertical axis is aligned with the stack of FIG. 6B and illustrates a width (wMH), e.g., diameter, of the memory holes 618 and 619. The word line layers WLL0-WLL10 of FIG. 6A are repeated as an example and are at respective heights z0-z10 in the stack. In such a memory device, the memory holes which are etched through the stack have a very high aspect ratio. For example, a depth-to-diameter ratio of about 25-30 is common. The memory holes may have a circular cross-section. Due to the etching process, the memory hole width can vary along the length of the hole. Typically, the diameter becomes progressively smaller from the top to the bottom of the memory hole. That is, the memory holes are tapered, narrowing at the bottom of the stack. In some cases, a slight narrowing occurs at the top of the hole near the select gate so that the diameter becomes slightly wider before becoming progressively smaller from the top to the bottom of the memory hole.

Due to the non-uniformity in the width of the memory hole, the programming speed, including the program slope and erase speed of the memory cells can vary based on their position along the memory hole, e.g., based on their height in the stack. With a smaller diameter memory hole, the electric field across the tunnel oxide is relatively stronger, so that the programming and erase speed is relatively higher. One approach is to define groups of adjacent word lines for which the memory hole diameter is similar, e.g., within a defined range of diameter, and to apply an optimized verify scheme for each word line in a group. Different groups can have different optimized verify schemes.

Figure 6D:
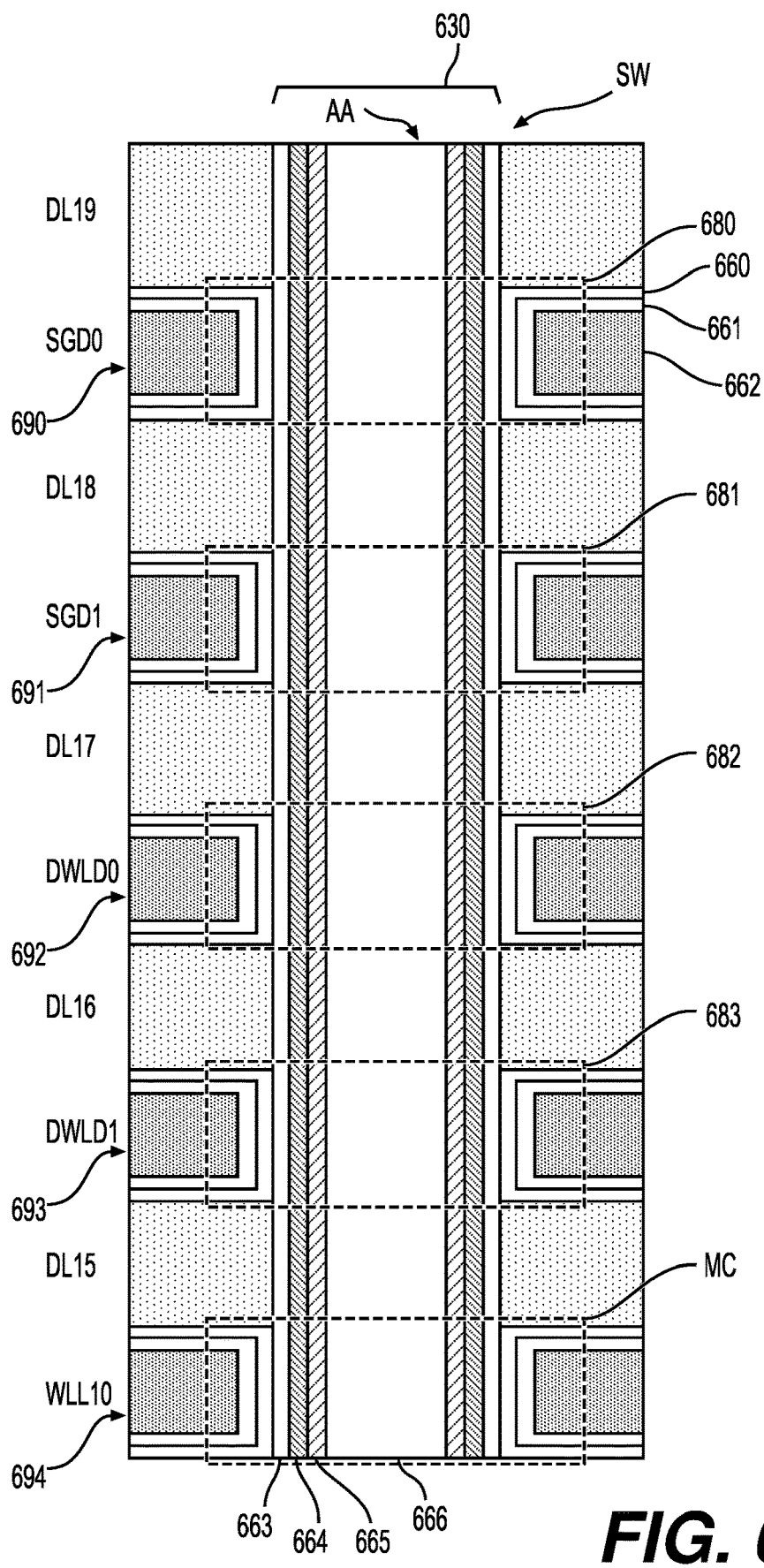
FIG. 6D depicts a close-up view of region 722 of the stack of FIG. 6B.

FIG. 6D illustrates a close-up view of the region 622 of the stack 610 of FIG. 6B. Memory cells are formed at the different levels of the stack at the intersection of a word line layer and a memory hole. In this example, SGD transistors 680, 681 are provided above dummy memory cells 682, 683 and a data memory cell MC. A number of layers can be deposited along the sidewall (SW) of the memory hole 630 and/or within each word line layer, e.g., using atomic layer deposition. For example, each column (e.g., the pillar which is formed by the materials within a memory hole 630) can include a charge-trapping layer or film 663 such as SiN or other nitride, a tunneling layer 664, a polysilicon body or channel 665, and a dielectric core 666. A word line layer can include a blocking oxide/block high-k material 660, a metal barrier 661, and a conductive metal 662 such as Tungsten as a control gate. For example, control gates 690, 691, 692, 693, and 694 are provided. In this example, all of the layers except the metal are provided in the memory hole 630. In other approaches, some of the layers can be in the control gate layer. Additional pillars are similarly formed in the different memory holes. A pillar can form a columnar active area (AA) of a NAND string.

When a data memory cell MC is programmed, electrons are stored in a portion of the charge-trapping layer 663 which is associated with the memory cell MC. These electrons are drawn into the charge-trapping layer 663 from the channel 665, and through the tunneling layer 664. The Vth of a memory cell MC is increased in proportion to the amount of stored charge. During an erase operation, the electrons return to the channel 665.

Each of the memory holes 630 can be filled with a plurality of annular layers comprising a blocking oxide layer, a charge trapping layer 663, a tunneling layer 664 and a channel layer 665. A core region of each of the memory holes 630 is filled with a body material, and the plurality of annular layers are between the core region and the word line in each of the memory holes 630.

The NAND string can be considered to have a floating body channel 665 because the length of the channel 665 is not formed on a substrate. Further, the NAND string is provided by a plurality of word line layers above one another in a stack, and separated from one another by dielectric layers.

Figure 7A:
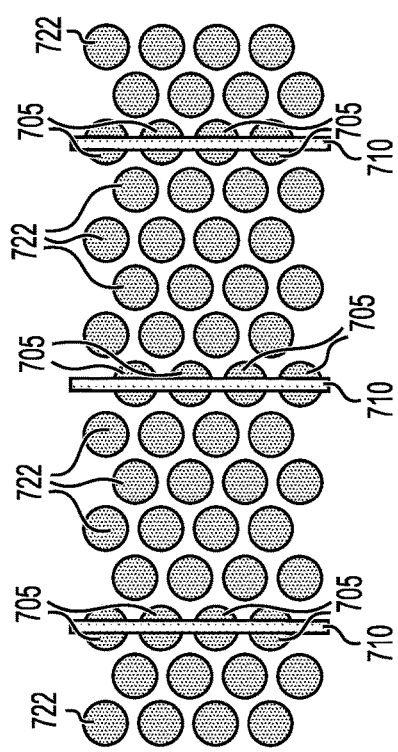
FIG. 7A depicts a top view of an example word line layer of an exemplary stack.

FIG. 7A shows a schematic plan view of a memory array 700 with a plurality of memory holes 722, which can be vertical memory cell strands as described herein, and a plurality of dummy holes 705, which need not one complete memory structures. A shallow trench etch or shallow etching feature (SHE) 710 extends through a plurality of word lines (for example, five) but not fully through the chip to electrically isolate adjacent strings from one another. The SHE extends directly through a group of aligned dummy holes 705, thereby preventing those dummy holes 705 from storing data or otherwise being functional memory cells.

Figure 8A:
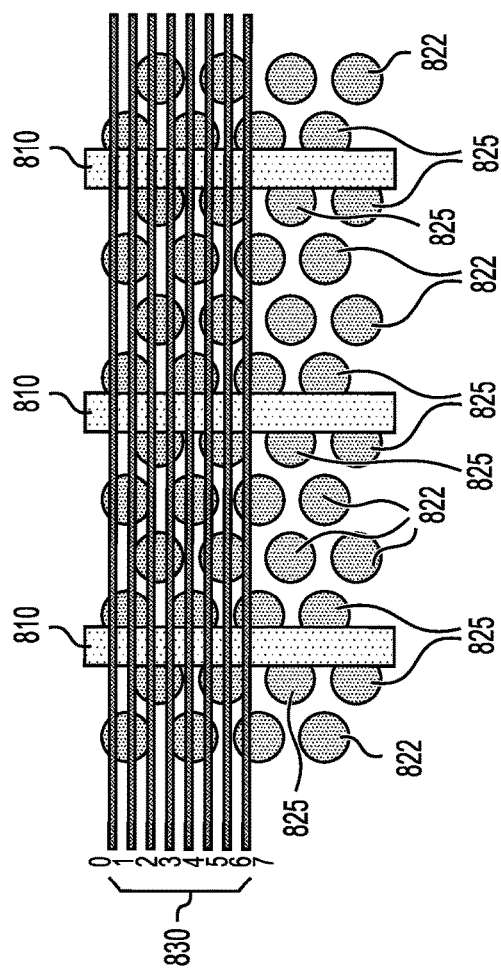
FIG. 8A depicts a top view of an example word line layer of another exemplary stack.
Figure 8B:
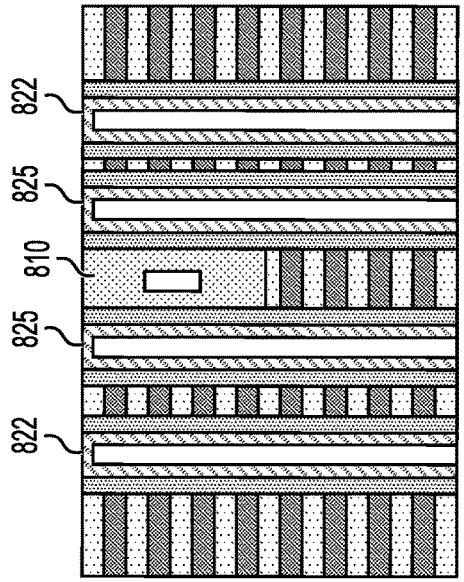
FIG. 8B depicts a cross-sectional view of the exemplary stack of FIG. 8A.
Figure 7B:
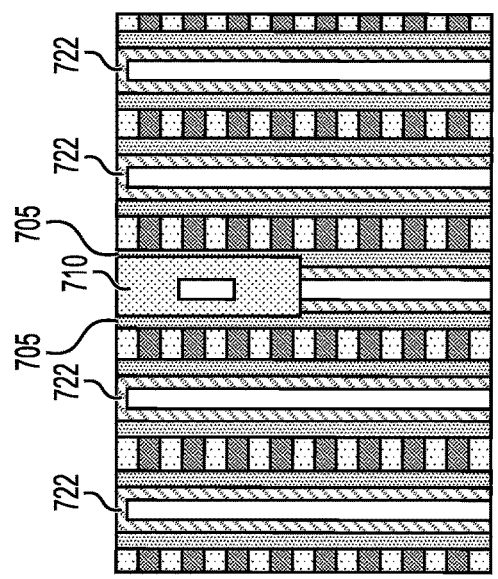
FIG. 7B depicts a cross-sectional view of the exemplary stack of FIG. 7A.

Referring now to FIGS. 8A and 8B, there are no dummy holes. Unlike the memory structure 700 of FIGS. 7A and 7B, the SHE 810 is located in a gap between two adjacent rows of memory cells and overlaps with memory holes 825, thereby creating a working strand that has a trench etched down into a side of at least the SGD switch at the top of the working memory strand, here shown as memory holes 825. This configuration substantially improves yield and memory density as all of the memory holes 822, 825 are functional, i.e., fewer memory holes are wasted.

Unlike the fully circular memory holes 822, the memory holes 825, including their respective SGDs, that are partially cut by the SHE 810 have a semi-circular shape, which can either be a half circle or can be more or less than a half-circle. Thus, the cut memory holes 825 are differently sized and shaped than the memory holes 825. In some cases, as discussed in further detail below, the memory holes 825 can be less than half circles on one side of the SHE 810 and more than half circles on the other side of the SHE 810. As discussed in further detail below, the memory cells that are coupled to semi-circle SGDs can have different programming characteristics than those coupled to full-circle SGDs. The techniques taught herein improve the uniformity of these memory cells both during and after programming.

The memory holes 822, 825 are connected with a plurality of bit lines 830 (labeled as bit lines 0-7 in FIG. 8). For ease of illustration, only eight bit lines 830 have been shown. The bit lines 830 extend over above the memory holes 822, 825 and are connected to select memory holes via connection points. The memory holes 822, 825 in the each string area are also connected at one end to an SGD switch and at the other end to an SGS switch.

Referring now to FIG. 9, due to variations and imperfections in a manufacturing operation, the SHE may be non-centrally located between adjacent rows of memory holes. When this occurs, the semi-circular SGDs on one side of the SHE trench may be dimensionally larger than the semi-circular SGDs on the other side of the SHE trench. The memory holes including the dimensionally larger SGDs are hereinafter called "undershifted SGDs," and the memory holes including the dimensionally smaller SGDs are hereinafter referred to as "overshifted memory holes." As illustrated, each string has one row of undershifted semi-circular SGDs, two rows of full-circle SGDs, and one row of overshifted semi-circular SGDs. With reference to String 1, Row 0 includes overshifted semi-circle SGDs 925b; Rows 1 and 2 include full-circle SGDs 922; and Row 3 includes undershifted semi-circle SGDs 925a.

FIG. 10 illustrates the voltages applied to various components of the memory block during an exemplary programming operation. During the programming operation, a Vpgm pulse is applied to a selected control gate corresponding with a selected word line being programmed, and a Vpass is applied to the control gates of any unselected word lines. At this time, the unselected SGDs are held at a low VSS voltage while the voltage of any selected SGDs is increased to VSGD. To prevent programming of any inhibited memory cells for which programming has been completed, an inhibit voltage VDDSA is applied to all unselected bit lines coupled to those inhibited memory cells. Finally, for all bit lines coupled to uninhibited memory cells of the selected word lines, the bit lines are held at a low VSS voltage or the voltage is increased to a quick pass write (QPW) voltage, which is less than VDDSA, during a second phase of a multi-phase programming operation to slow programming of memory cells for which programming is nearly completed. As discussed in further detail below, in some embodiments, the VSGD and QPW voltages applied to the semi-circle SGDs may be adjusted, or biased, to improve programming performance and reliability.

Figures 11A, 11B:
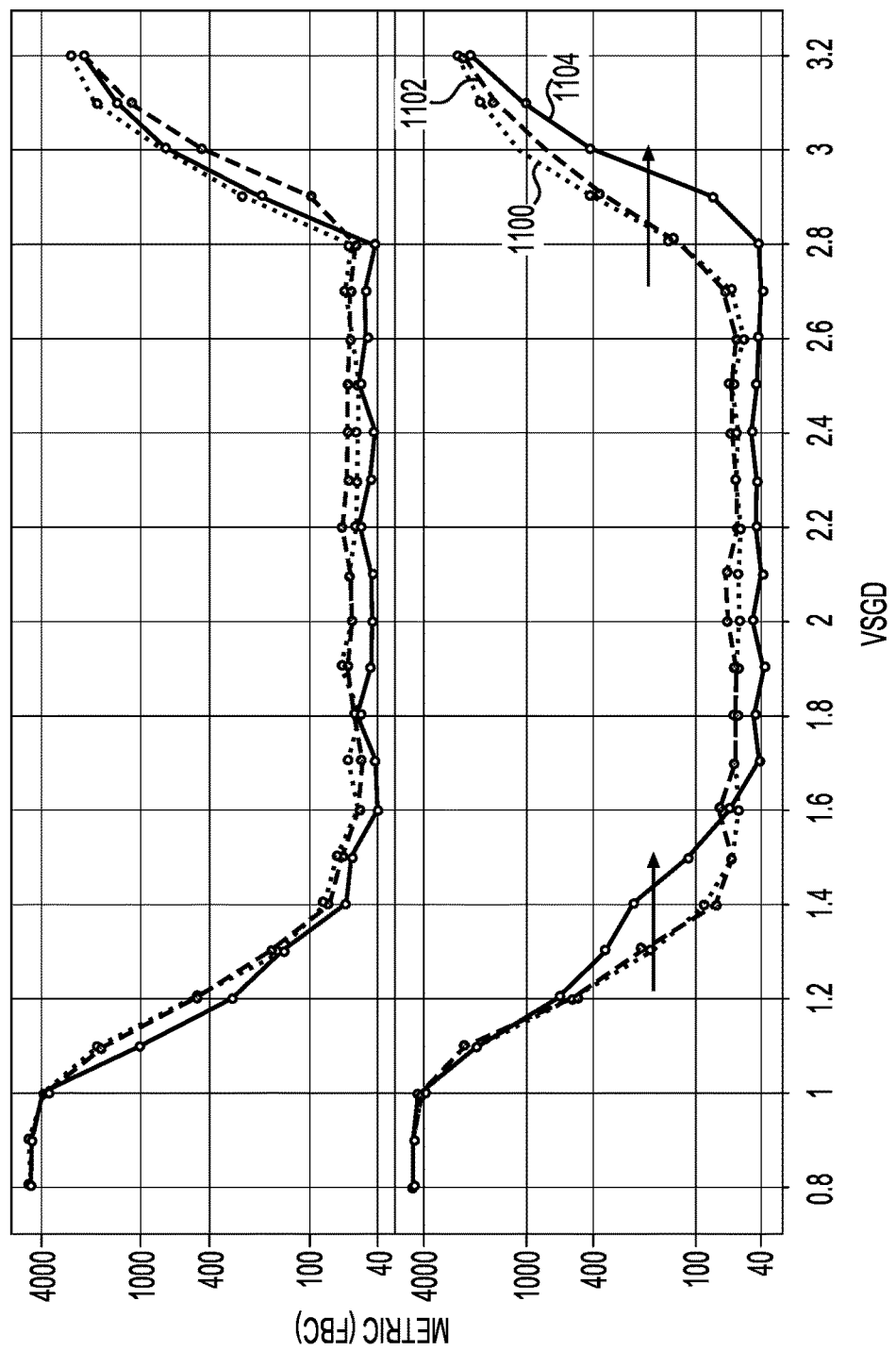
FIG. 11A depicts a plot of a VSGD margin of three memory cells coupled with full-circle SGDs.
FIG. 11B depicts a plot of a VSGD margin of three memory cells coupled with semi-circle SGDs.

Referring now to FIG. 11A, a plot of VSGD voltage vs. fail bit count (FBC) is illustrated for a plurality of full circle SGDs. As shown, for all three of the full circle SGDs tested, the FBC is high at low voltages, which corresponds with a QPW voltage and is high at a high voltage, which corresponds with a VDDSA voltage.

Turning now to FIG. 11B, a similar plot is shown as FIG. 11A but with one line 1100 identifying the VSGD margin of a normal semi-circle SGD (a perfectly located SHE such that the SGDs on either side of the SHE are symmetrical); a second line 1102 identifying the VSGD margin of a semi-circular, undershifted SGD; and third line 1104 identifying the VSGD margin of a semi-circular, overshifted SGD. As shown, the plot of the overshifted SGD's VSGD margin generally follows that of the other two but is shifted right-ward by approximately 0.2 V. Thus, at certain voltages, the max FBC of the overshifted SGD is either greater or less than that of the other semi-circular SGDs. Having different VSGD biases for differently shaped SGDs could in some cases lead to unintentional programming of one or more memory cells, which could result in data loss. Some of the following techniques may be employed to counter the effects of this shifted VSGD margin for overshifted SGDs, thereby reducing the probability of unintentional programming of memory cells occurring. As discussed in further detail below, to achieve a similar VSGD window for both semi-circular and full-circle SGDs, bit line bias voltages are applied to certain bit lines coupled to the semi-circular SGDs to compensate for the VSGD window shifts.

Figure 12:
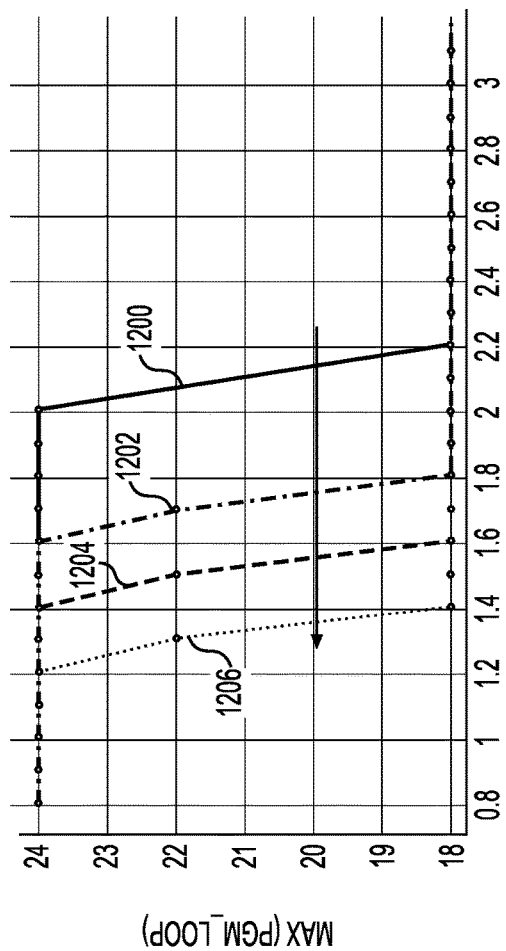
FIG. 12 depicts a plot of voltage versus fail bit count for memory cells programmed using differing QPW voltages.
Figure 13:
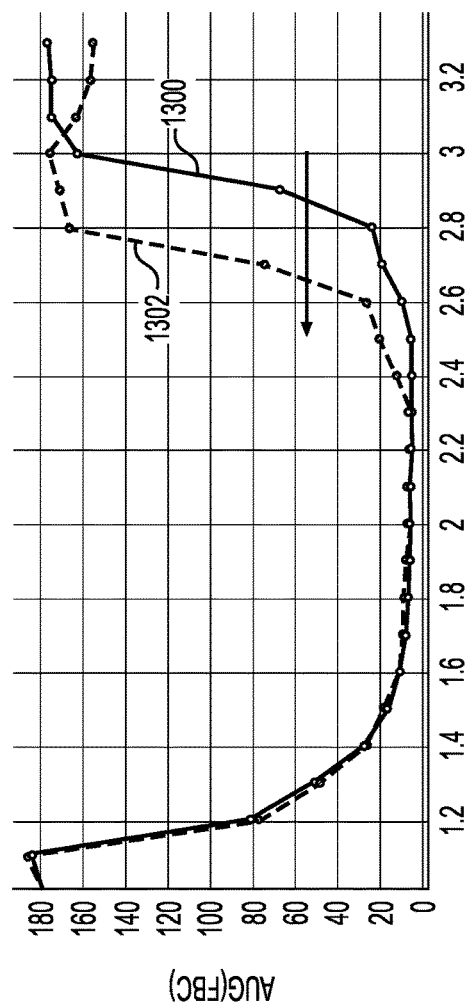
FIG. 13 depicts a plot of voltage versus fail bit count for memory cells that are inhibited from programming with differing inhibiting voltages.

As shown in FIG. 12, the location of the lower cliff of the VSGD margin shown in FIGS. 11A and 11B discussed above, is dependent on the magnitude of the QPW bit line voltage with the cliff shifting right-ward (higher voltage) with an increasing QPW bit line voltage. Specifically, in this example, as indicated with line 1200, the cliff associated with a QPW voltage of 0.85 V is associated with the highest voltage. Lines 1202, 1204, and 1206 are associated with QPW voltages of 0.7 V, 0.3 V, and 0.1 V respectively and have cliffs that are located at sequentially lower voltages. Similarly, the location of the upper cliff of the VSGD margin shown in FIGS. 10A and 10B as discussed above, is dependent on the magnitude of the VDDSA inhibit voltage. Specifically, as shown in FIG. 13, line 1300, which is associated with a VDDSA of 2.0 V is further right (higher voltage) than line 1302, which is associated with a VDDSA of 1.8 V. Thus, the greater the magnitude of the VDDSA voltage, the higher voltage the upper cliff will be located at.

By utilizing the known effects a bit line voltage has on the VSGD margin, the techniques of the present disclosure apply biasing voltages to the bit line to counter the effects that the overshifted semi-circle SGDs have on the VSGD margins during QPW programming of uninhibited memory cells and while inhibiting the programming of inhibited memory cells. FIG. 14 is a table illustrating example voltages that are applied to the bit lines coupled to the memory holes of String 1 of the memory block shown in FIG. 9. As shown in FIG. 14, a biasing voltage of ΔVBLC_QPW1 is added to the bit lines coupled with the memory cells of Row 0, which includes the overshifted semi-circle SGDs, during the QPW programming operation, and a biasing voltage of ΔVDDSA1 is added to the bit lines coupled with the memory cells of Row 0 that are being inhibited during the programming operation. In other words, the QPW and VDDSA voltage are increased for the memory cells coupled to overshifted semi-circle SGDs. In this embodiment, no biasing voltages are applied to the bit lines to the memory cells being programmed with QPW or being inhibited from programming in Rows 1-3. The biasing voltages ΔVBLC_QPW1 and ΔVDDSA1 counter the aforementioned VSGD shift to better align the VSGD margin of Row 0 to match those of Rows 1-3, thereby reducing or preventing unintentional programming of any memory cells of Row 0. Similar biasing voltages can be applied for the undershifted semi-circular SGDs of the other strings of the memory block as well.

FIG. 15 is a table that illustrates example voltages applied to the bit lines coupled to the memory holes of String 1 of the memory block shown in FIG. 9 according to an alternate embodiment. Like this embodiment, the biasing voltages ΔVBLC_QPW1 and ΔVDDSA1 compensate for the overshifted semi-circle SGDs of Row 0. However, in this embodiment additional biasing voltages ΔVBLC_QPW2 and ΔVDDSA2 are applied to the bit lines coupled to the memory cells being programmed with QPW and being inhibited from programming respectively in Row 3, which includes the undershifted semi-circle SGDs. This may further improve the matching of the VSGD window of the undershifted semi-circle SGDs of Row 3 to the full circle SGDs of Rows 1 and 2.

FIG. 16 is a table that illustrates example voltages applied to the bit lines coupled to the memory holes of String 1 of the memory block shown in FIG. 9 according to another alternate embodiment. In this embodiment, the biasing voltages applied to the bit lines during QPW programming of some cells and to inhibit programming of other cells are further chosen based on how far the string is from the sense amps. Thus, each zone has its own respective ΔVBLC_QPW1, ΔVBLC_QPW2, ΔVDDSA1, and ΔVDDSA2 biasing voltages that are applied to the Row 0 and Row 3 bit lines during QPW programming or to inhibit programming of memory cells. In some embodiments, the biasing voltages increase with distance from the sense amps.

In this embodiment, for Row 0 (the overshifted semi-circle SGDs), the biasing voltage during QPW is ΔVBLC_QPW1 Zone0 for Zone 0 (furthest for the relay), ΔVBLC_QPW1 Zone1 for Zone 1 (middle), and ΔVBLC_QPW1 Zone2 for Zone 2 (nearest the relay). For inhibit, the biasing voltage is ΔVDDSA1 Zone® for Zone 0, ΔVDDSA1 Zone1 for Zone 1, and ΔVDDSA1 Zone2 for Zone 2. For Row 3 (the undershifted semi-circle SGDs), the biasing voltage during QPW is ΔVBLC_QPW2 Zone® for Zone 0 (furthest for the relay), ΔVBLC_QPW2 Zone1 for Zone 1 (middle), and ΔVBLC_QPW2 Zone2 for Zone 2 (nearest the relay). For inhibit, the biasing voltage is ΔVDDSA2 Zone® for Zone 0, ΔVDDSA2 Zone1 for Zone 1, and ΔVDDSA2 Zone2 for Zone 2. No biasing voltages are applied to the bit lines coupled to the full-circle SGDs during programming.

Figure 17:
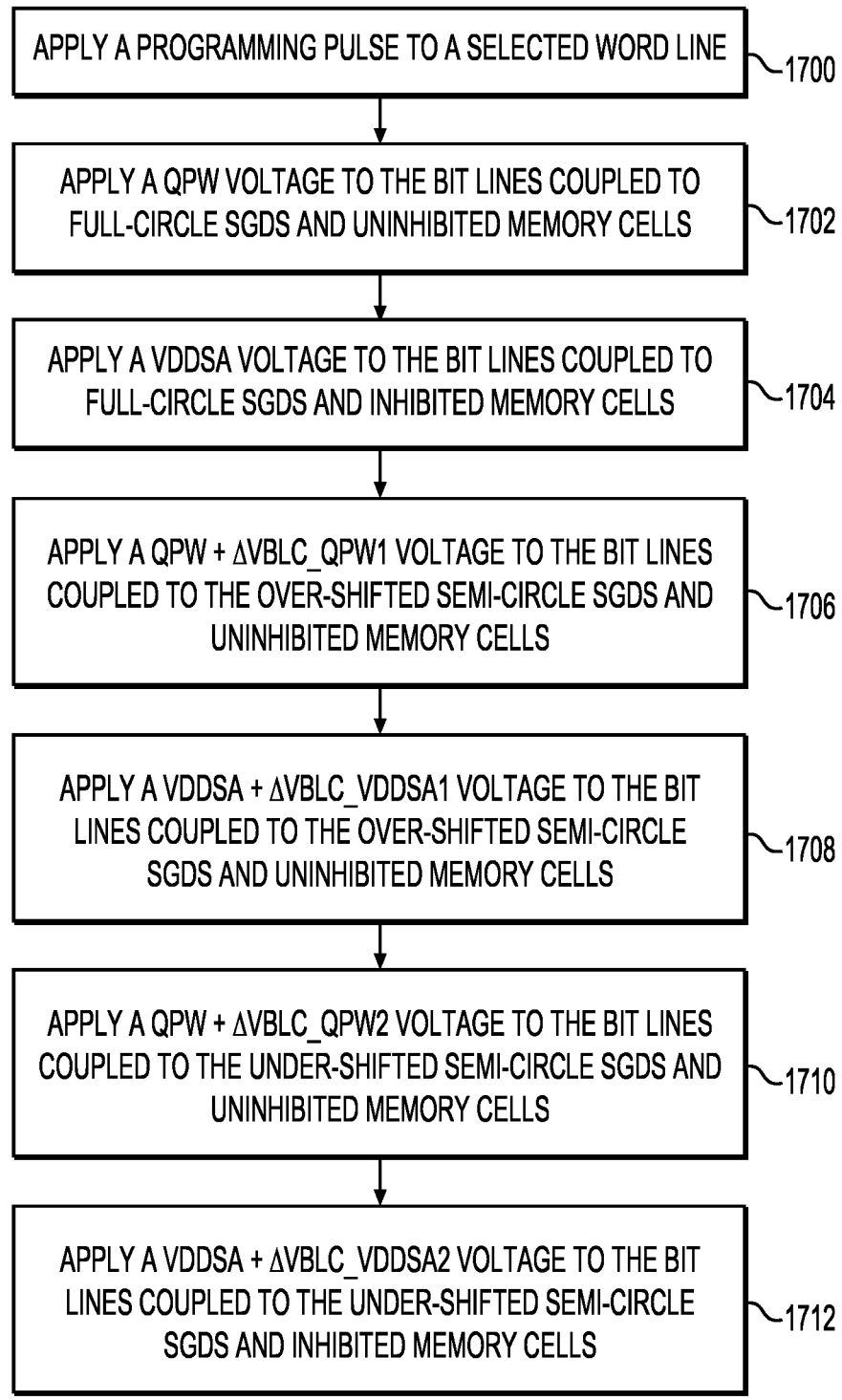
FIG. 17 is a flow chart illustrating the steps of a programming operation according to one aspect of the present disclosure.

FIG. 17 depicts a flow chart of an exemplary programming operation to achieve a similar VSGD window across different semi-circle SGD shapes and allow for a larger SHE shift tolerance without compromising performance. At step 1700, a Vpgm programming pulse is applied to a selected word line that includes a first group of memory cells (memory cells coupled to full-circle SGDs), a second group of memory cells (memory cells coupled to semi-circle over-shifted SGDs), and a third group of memory cells (memory cells coupled to semi-circle under-shifted SGDs).

At step 1702, a QPW voltage is applied to the bit lines coupled to the full-circled SGDs and the uninhibited memory cells. At step 1704, a VDDSA voltage is applied to the bit lines coupled to the full-circle SGDs and inhibited memory cells. At step 1706, a voltage of QPW+ΔVBLC_QPW1 is applied to the bit lines coupled to over-shifted semi-circle SGDs and uninhibited memory cells. At step 1708, a voltage of VDDSA+ΔVDDSA1 is applied to the bit lines coupled to the over-shifted semi-circle SGDs and inhibited memory cells. At step 1710, a voltage of QPW+ΔVBLC_QPW2 is applied to the bit lines coupled to under-shifted semi-circle SGDs and uninhibited memory cells. At 1712, a voltage of VDDSA+ΔVDDSA1 is applied to the bit lines coupled to the under-shifted semi-circle SGDs and inhibited memory cells. All of steps 1700-1712 are preferably performed at least partially simultaneous with one another.

Figure 18:
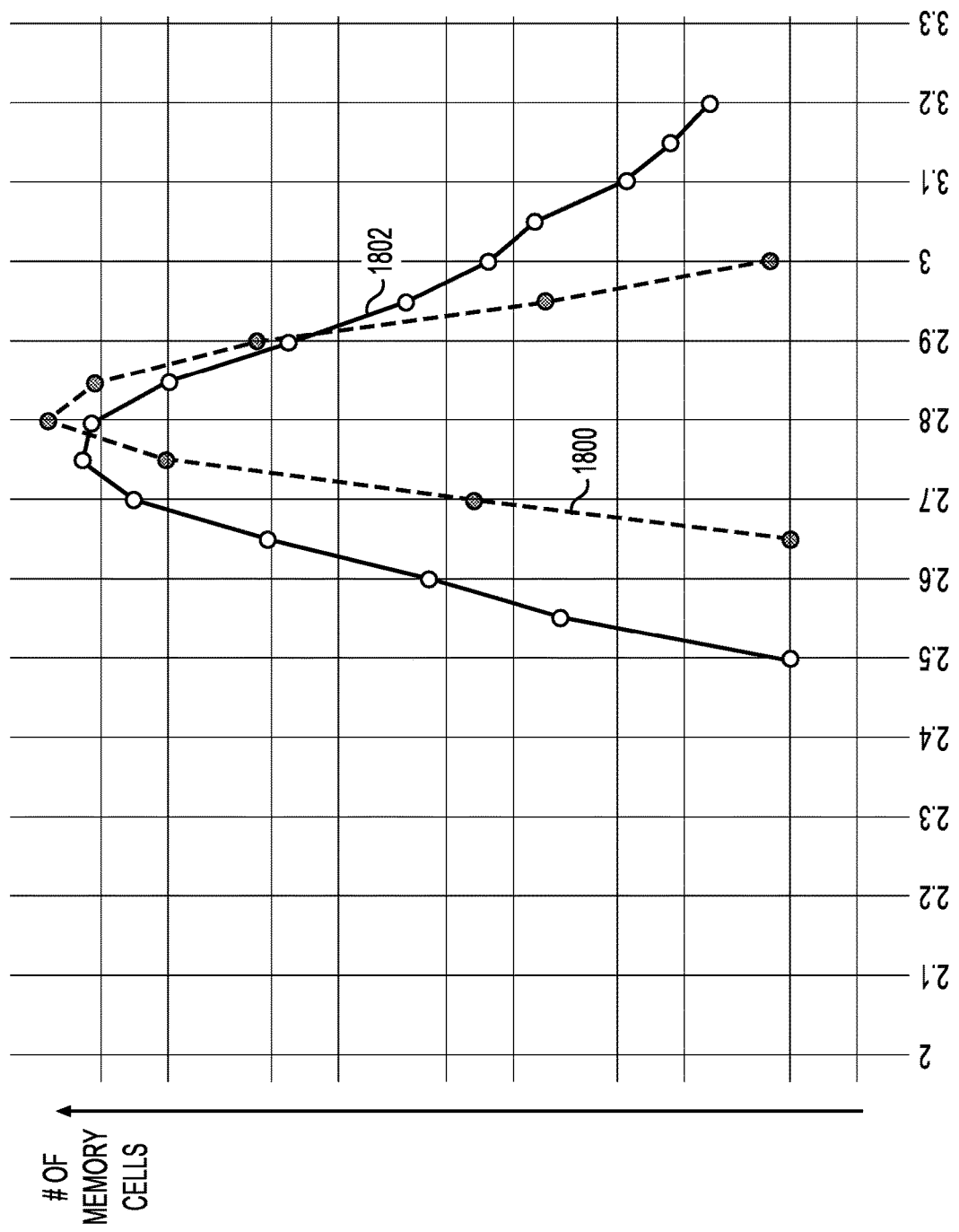
FIG. 18 illustrates a Vt threshold chart for one programmed data state and including both memory cells coupled to full-circle SGDs and memory cells coupled to semi-circle SGDs.

Referring now to FIG. 18, the Vt distribution of a plurality of memory cells programmed to a given data state on a memory block that includes both full-circle SGDs and semi-circle SGDs is generally shown with line 1800 identifying the memory cells coupled with the full-circle SGDs and line 1802 identifying the memory cells coupled with the semi-circle SGDs. During the programming operation that produced these Vt distributions, the same bit line voltage was applied to all of the memory cells during all of the programming loops. As shown, an upper-tail of the Vt distribution of the memory cells of the semi-circle SGDs is misshapen in that it extends past (higher voltage) than an upper tail of the memory cells of the full-circle SGDs. This occurs because the lower cliff of the VSGD margin shown in FIGS. 11A and 11B is related to the upper tail of the Vt distribution. If not corrected, this phenomenon can cause a loss in a lower tail of the aforementioned VSGD margin and may pose a reliability risk.

The higher upper tail of the Vt distributions of memory cells coupled to semi-circle SGDs has been found to have been caused by semi-circle SGDs typically including a higher number of faster to program memory cells. Due to this, if the same VPGM voltage is used to program memory cells couple with both full-circle and semi-circle SGDs, some of the memory cells coupled to the semi-circle SGDs can be overprogrammed.

It has been found that the higher upper tail of the Vt distribution typically is formed during the first couple of programming loops of a programming operation that starts with all of the memory cells in an erased condition. It has also been found that these fast to program memory cells have a higher drawn-induced barrier loading (DIBL). This high DIBL can have consequences holding the channel potential of an unselected NAND string high, thereby making it more difficult to shut off the SHD switch.

With reference to FIG. 19, during the verify operations of the first few programming loops, the bit line voltage that is applied to the bit lines coupled to the semi-circle SGDs is lowered as compared to the bit line voltage that is applied to the bit lines coupled to the full circle SGDs and as compared to the bit line voltage that is applied to both of the semi-circle and full-circle SGDs in the following program loops until the programming operation is completed. In this specific example, the bit line voltage applied to the bit lines coupled to the semi-circle SGDs is reduced for only the first four program loops, and the magnitude of the voltage reduction is 0.05 V. Specifically, the bit line voltage applied to the bit lines coupled to the semi-circle SGDs during the first four program loops is 0.10 V, and the bit line voltages applied to the bit lines coupled to the full-circle SGDs during all program loops and applied to the bit lines coupled to the semi-circle SGDs during the remaining program loops is 0.15 V. The bit line voltage that is applied during a read operation, which follows completion of the programming operation, is also 0.15 V. Thus, the bit line voltage during the read operation is greater than the bit line voltage applied to the bit lines coupled to the semi-circle SGDs during verify of the first few programming loops. In some embodiments, the number of program loops may be less than or greater than four, but it is at least one and is no greater than one third of the total program loops.

Because the fast to program memory cells that have the higher DIBL form the high Vt upper tail, verifying those memory cells with a lower bit line voltage makes these memory cells pass program verify at an earlier program loop, i.e., programming of at least one programmed data state is completed more quickly. When the higher bit line voltage is applied during the read operation, the Vts of these fast to program memory cells that were programmed earlier shift downward due to their higher DIBL, thereby improving the upper tail of the Vt distribution of these memory cells.

Figure 20:
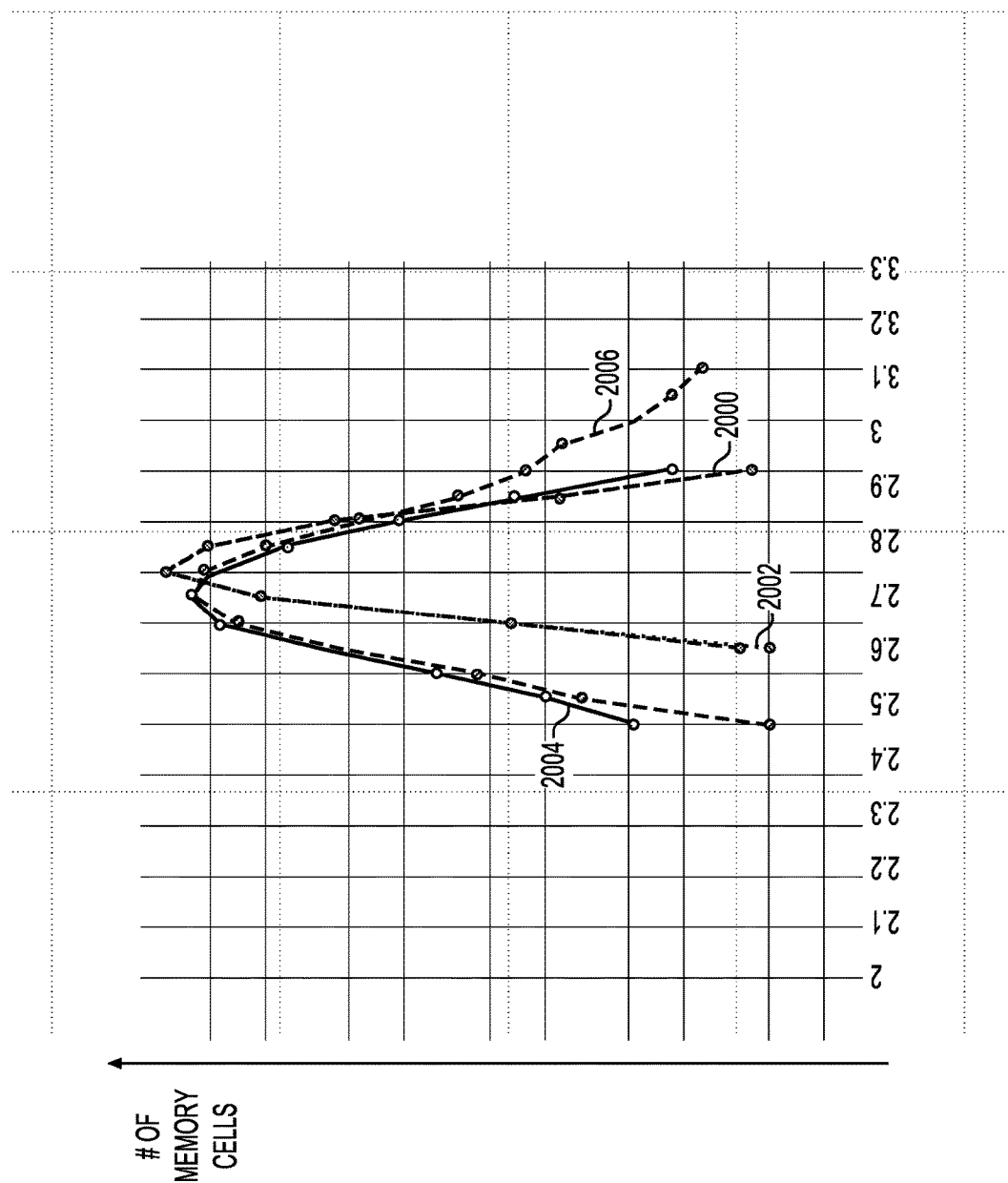
FIG. 20 illustrates a Vt threshold chart for one programmed data state including memory cells coupled to full-circle SGDs and verified with a first bit line voltage, memory cells coupled to full-circle SGDs and verified with a second bit line voltage, memory cells coupled to semi-circle SGDs and verified with the first bit line voltage, and memory cells coupled to semi-circle SGDs and verified with the second bit line voltage.

FIG. 20 shows the Vt distributions of a plurality of memory cells including memory cells coupled to full-circle SGDs and verified with a 0.15 V bit line voltage (line 2000); memory cells coupled to full-circle SGDs and verified with a 0.10 V bit line voltage (line 2002); memory cells coupled to semi-circle SGDs and verified with a 0.10 V bit line voltage (line 2004); and memory cells coupled to semi-circle SGDs and verified with a 0.15 V bit line voltage (line 2006). As shown, the upper tail of the Vt distribution memory cells coupled to the semi-circle SGDs more closely matches that of the full-circle SGDs. This improvement is achieved without any tProg impact.

Figure 21:
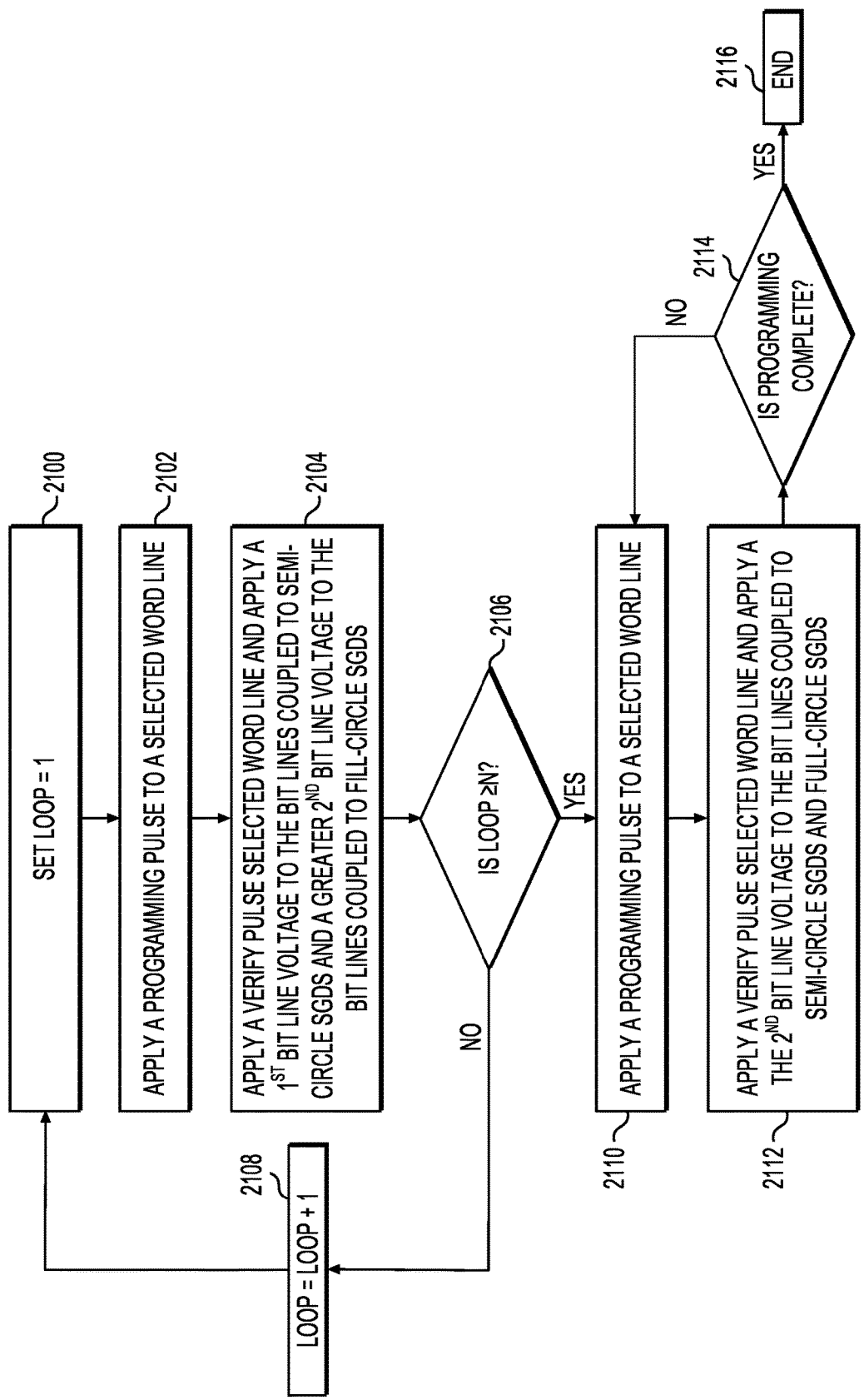
FIG. 21 is a flow chart illustrating the steps of a programming operation according to another aspect of the present disclosure.

Referring now to FIG. 21, a flow chart depicting another programming operation is shown. At step 2100, a loop counter (Loop) is set to 1.

At step 2102, a programming pulse Vpgm is applied to the control gate of a selected word line.

At step 2104, a verify pulse is applied to the control gate of the selected word line; a first bit line voltage (e.g., 0.10 V) is applied to the bit lines coupled to semi-circle SGDs and memory cells being programmed; and a second bit line voltage (e.g., 0.15 V) is applied to the bit lines coupled to full-circle SGDs and memory cells being programmed.

At step 2106, it is determined if Loop is greater than or equal to a predetermined number N of programming loops to use the first bit line voltage. In the exemplary embodiment depicted in FIG. 19, N is 4. In other embodiments, N could be less than or greater than 4, but it is preferred that N be less than a third of a total number of programming loops.

If the answer at step 2106 is no (i.e., Loop is less than N), then at step 2108, Loop is incrementally advanced (Loop=Loop+1), and the process returns to step 2102 to start another programming loop. Between programming loops, the magnitude of the Vpgm programming pulse may be incrementally increased (e.g., Vpgm=Vpgm+dVpgm), and one or more memory cells may be inhibited from further programming if programming has been completed.

If the answer at step 2106 is yes, then at step 2110, another programming loop begins with applying a programming pulse to the selected word line.

At step 2112, a verify pulse is applied to the second word line as the second bit line voltage is applied to the bit lines coupled to both the semi-circle SGDs and the full-circle SGDs as well as the non-inhibited memory cells.

At step 2114, it is determined if programming of the final data state is completed.

If the answer at decision step is no, then the programming voltage Vpgm may be advanced (e.g., Vpgm=Vpgm+dVpgm) and one or more memory cells may be inhibited from further programming before the process returns to step 2110 to begin another programming loop.

If the answer at decision step 2114 is yes, then at step 2116, programming is completed.

The several aspects of the present disclosure may be embodied in the form of an apparatus, system, method, or computer program process. Therefore, aspects of the present disclosure may be entirely in the form of a hardware embodiment or a software embodiment (including but not limited to firmware, resident software, micro-code, or the like), or may be a combination of both hardware and software components that may generally be referred to collectively as a "circuit," "module," "apparatus," or "system." Further, various aspects of the present disclosure may be in the form of a computer program process that is embodied, for example, in one or more non-transitory computer-readable storage media storing computer-readable and/or executable program code.

Additionally, various terms are used herein to refer to particular system components. Different companies may refer to a same or similar component by different names and this description does not intend to distinguish between components that differ in name but not in function. To the extent that various functional units described in the following disclosure are referred to as "modules," such a characterization is intended to not unduly restrict the range of potential implementation mechanisms. For example, a "module" could be implemented as a hardware circuit that includes customized very-large-scale integration (VLSI) circuits or gate arrays, or off-the-shelf semiconductors that include logic chips, transistors, or other discrete components. In a further example, a module may also be implemented in a programmable hardware device such as a field programmable gate array (FPGA), programmable array logic, a programmable logic device, or the like. Furthermore, a module may also, at least in part, be implemented by software executed by various types of processors. For example, a module may comprise a segment of executable code constituting one or more physical or logical blocks of computer instructions that translate into an object, process, or function. Also, it is not required that the executable portions of such a module be physically located together, but rather, may comprise disparate instructions that are stored in different locations and which, when executed together, comprise the identified module and achieve the stated purpose of that module. The executable code may comprise just a single instruction or a set of multiple instructions, as well as be distributed over different code segments, or among different programs, or across several memory devices, etc. In a software, or partial software, module implementation, the software portions may be stored on one or more computer-readable and/or executable storage media that include, but are not limited to, an electronic, magnetic, optical, electro-magnetic, infrared, or semiconductor-based system, apparatus, or device, or any suitable combination thereof. In general, for purposes of the present disclosure, a computer-readable and/or executable storage medium may be comprised of any tangible and/or non-transitory medium that is capable of containing and/or storing a program for use by or in connection with an instruction execution system, apparatus, processor, or device.

Similarly, for the purposes of the present disclosure, the term "component" may be comprised of any tangible, physical, and non-transitory device. For example, a component may be in the form of a hardware logic circuit that is comprised of customized VLSI circuits, gate arrays, or other integrated circuits, or is comprised of off-the-shelf semiconductors that include logic chips, transistors, or other discrete components, or any other suitable mechanical and/or electronic devices. In addition, a component could also be implemented in programmable hardware devices such as field programmable gate arrays (FPGA), programmable array logic, programmable logic devices, etc. Furthermore, a component may be comprised of one or more silicon-based integrated circuit devices, such as chips, die, die planes, and packages, or other discrete electrical devices, in an electrical communication configuration with one or more other components via electrical conductors of, for example, a printed circuit board (PCB) or the like. Accordingly, a module, as defined above, may in certain embodiments, be embodied by or implemented as a component and, in some instances, the terms module and component may be used interchangeably.

Where the term "circuit" is used herein, it includes one or more electrical and/or electronic components that constitute one or more conductive pathways that allow for electrical current to flow. A circuit may be in the form of a closed-loop configuration or an open-loop configuration. In a closed-loop configuration, the circuit components may provide a return pathway for the electrical current. By contrast, in an open-looped configuration, the circuit components therein may still be regarded as forming a circuit despite not including a return pathway for the electrical current. For example, an integrated circuit is referred to as a circuit irrespective of whether the integrated circuit is coupled to ground (as a return pathway for the electrical current) or not. In certain exemplary embodiments, a circuit may comprise a set of integrated circuits, a sole integrated circuit, or a portion of an integrated circuit. For example, a circuit may include customized VLSI circuits, gate arrays, logic circuits, and/or other forms of integrated circuits, as well as may include off-the-shelf semiconductors such as logic chips, transistors, or other discrete devices. In a further example, a circuit may comprise one or more silicon-based integrated circuit devices, such as chips, die, die planes, and packages, or other discrete electrical devices, in an electrical communication configuration with one or more other components via electrical conductors of, for example, a printed circuit board (PCB). A circuit could also be implemented as a synthesized circuit with respect to a programmable hardware device such as a field programmable gate array (FPGA), programmable array logic, and/or programmable logic devices, etc. In other exemplary embodiments, a circuit may comprise a network of non-integrated electrical and/or electronic components (with or without integrated circuit devices). Accordingly, a module, as defined above, may in certain embodiments, be embodied by or implemented as a circuit.

It will be appreciated that example embodiments that are disclosed herein may be comprised of one or more microprocessors and particular stored computer program instructions that control the one or more microprocessors to implement, in conjunction with certain non-processor circuits and other elements, some, most, or all of the functions disclosed herein. Alternatively, some or all functions could be implemented by a state machine that has no stored program instructions, or in one or more application-specific integrated circuits (ASICs) or field-programmable gate arrays (FPGAs), in which each function or some combinations of certain of the functions are implemented as custom logic. A combination of these approaches may also be used. Further, references below to a "controller" shall be defined as comprising individual circuit components, an application-specific integrated circuit (ASIC), a microcontroller with controlling software, a digital signal processor (DSP), a field programmable gate array (FPGA), and/or a processor with controlling software, or combinations thereof.

Further, the terms "program," "software," "software application," and the like as may be used herein, refer to a sequence of instructions that is designed for execution on a computer-implemented system. Accordingly, a "program," "software," "application," "computer program," or "software application" may include a subroutine, a function, a procedure, an object method, an object implementation, an executable application, an applet, a servlet, a source code, an object code, a shared library/dynamic load library and/or other sequence of specific instructions that is designed for execution on a computer system.

Additionally, the terms "couple," "coupled," or "couples," where may be used herein, are intended to mean either a direct or an indirect connection. Thus, if a first device couples, or is coupled to, a second device, that connection may be by way of a direct connection or through an indirect connection via other devices (or components) and connections.

Regarding, the use herein of terms such as "an embodiment," "one embodiment," an "exemplary embodiment," a "particular embodiment," or other similar terminology, these terms are intended to indicate that a specific feature, structure, function, operation, or characteristic described in connection with the embodiment is found in at least one embodiment of the present disclosure. Therefore, the appearances of phrases such as "in one embodiment," "in an embodiment," "in an exemplary embodiment," etc., may, but do not necessarily, all refer to the same embodiment, but rather, mean "one or more but not all embodiments" unless expressly specified otherwise. Further, the terms "comprising," "having," "including," and variations thereof, are used in an open-ended manner and, therefore, should be interpreted to mean "including, but not limited to . . . " unless expressly specified otherwise. Also, an element that is preceded by "comprises . . . a" does not, without more constraints, preclude the existence of additional identical elements in the subject process, method, system, article, or apparatus that includes the element.

The terms "a," "an," and "the" also refer to "one or more" unless expressly specified otherwise. In addition, the phrase "at least one of A and B" as may be used herein and/or in the following claims, whereby A and B are variables indicating a particular object or attribute, indicates a choice of A or B, or both A and B, similar to the phrase "and/or." Where more than two variables are present in such a phrase, this phrase is hereby defined as including only one of the variables, any one of the variables, any combination (or sub-combination) of any of the variables, and all of the variables.

Further, where used herein, the term "about" or "approximately" applies to all numeric values, whether or not explicitly indicated. These terms generally refer to a range of numeric values that one of skill in the art would consider equivalent to the recited values (e.g., having the same function or result). In certain instances, these terms may include numeric values that are rounded to the nearest significant figure.

In addition, any enumerated listing of items that is set forth herein does not imply that any or all of the items listed are mutually exclusive and/or mutually inclusive of one another, unless expressly specified otherwise. Further, the term "set," as used herein, shall be interpreted to mean "one or more," and in the case of "sets," shall be interpreted to mean multiples of (or a plurality of) "one or more," "ones or more," and/or "ones or mores" according to set theory, unless expressly specified otherwise.

The foregoing detailed description has been presented for purposes of illustration and description. It is not intended to be exhaustive or be limited to the precise form disclosed. Many modifications and variations are possible in light of the above description. The described embodiments were chosen to best explain the principles of the technology and its practical application to thereby enable others skilled in the art to best utilize the technology in various embodiments and with various modifications as are suited to the particular use contemplated. The scope of the technology is defined by the claims appended hereto.

What is claimed is:

1. A method of programming a memory device, comprising the steps of:
providing a memory device that includes a plurality of memory cells, a first group of the memory cells being coupled to full select gate drains and a second group of the memory cells being coupled to partial select gate drains;
applying a programming voltage to a selected word line that includes at least one memory cell of the first group and at least one memory cell of the second group, and
simultaneous to applying the programming voltage, applying voltages to bit lines coupled to memory cells, the voltages being determined based on if the memory cells are of the first group or of the second group.

2. The method as set forth in claim 1 wherein a voltage applied to at least one of the bit lines coupled to one of the memory cells of the second group is equal to a voltage applied to at least one of the bit lines coupled to the one of the memory cells of the first group plus a predetermined biasing voltage.

3. The method as set forth in claim 1 wherein the selected word line includes at least one uninhibited memory cell of the first group, at least one uninhibited memory cell of the second group, at least one inhibited memory cell of the first group, and at least one inhibited memory cell of the second group, and wherein a voltage applied to the bit line coupled to the uninhibited memory cell of the first group is different than a voltage applied to the bit line coupled to the uninhibited memory cell of the second group or a voltage applied to the bit line coupled to the inhibited memory cell of the first group is different than a voltage applied to the inhibited memory cell of the second group.

4. The method as set forth in claim 3 wherein both the voltage applied to the bit line coupled to the uninhibited memory cell of the first group is different than the voltage applied to the bit line coupled to the uninhibited memory cell of the second group and the voltage applied to the bit line coupled to the inhibited memory cell of the first group is different than the voltage applied to the inhibited memory cell of the second group.

5. The method as set forth in claim 3 wherein the memory device further includes a third group of memory cells that are coupled to partial select gate drains that are differently shaped than the partial select gate drains coupled to the memory cells of the second group.

6. The method as set forth in claim 5 wherein the selected word line includes at least one uninhibited memory cell of the third group and at least one inhibited memory cell of the third group, and further including the step of simultaneous to applying the programming voltage, applying a different voltage to at least one bit line coupled to the at least one uninhibited memory cell of the third group than the voltages that are applied to the bit lines coupled to the uninhibited memory cells of the first and second groups, or simultaneous to applying the programming voltage, applying a different voltage to at least one bit line coupled to the at least one inhibited memory cell of the third group than the voltages that are applied to the bit lines coupled to the inhibited memory cells of the first and second groups.

7. The method as set forth in claim 1 wherein the voltages applied to the bit lines coupled to memory cells of the first group are equal to the voltages applied to the bit lines coupled to memory cells of the second group plus a biasing voltage.

8. A memory device, comprising:
    a plurality of memory cells including a first group of memory cells that are coupled to full select gate drains and a second group of memory cells that are coupled to partial select gate drains;
    a controller configured to;
        apply a programming voltage to a selected word line that includes at least one memory cell of the first group and at least one memory cell of the second group, and
        simultaneous to the application of the programming voltage, apply voltages to bit lines coupled to memory cells, the voltages being determined based on if the memory cells are of the first group or of the second group.

9. The memory device as set forth in claim 8 wherein a voltage applied by the controller to at least one of the bit lines coupled to one of the memory cells of the second group is equal to a voltage applied by the controller to at least one of the bit lines coupled to the one of the memory cells of the first group plus a predetermined biasing voltage.

10. The memory device as set forth in claim 8 wherein the selected word line includes at least one uninhibited memory cell of the first group, at least one uninhibited memory cell of the second group, at least one inhibited memory cell of the first group, and at least one inhibited memory cell of the second group, and wherein a voltage applied by the controller to the bit line coupled to the uninhibited memory cell of the first group is different than a voltage applied by the controller to the bit line coupled to the uninhibited memory cell of the second group or a voltage applied by the controller to the bit line coupled to the inhibited memory cell of the first group is different than a voltage applied by the controller to the inhibited memory cell of the second group.

11. The memory device as set forth in claim 10 wherein both the voltage applied by the controller to the bit line coupled to the uninhibited memory cell of the first group is different than the voltage applied by the controller to the bit line coupled to the uninhibited memory cell of the second group and the voltage applied by the controller to the bit line coupled to the inhibited memory cell of the first group is different than the voltage applied by the controller to the inhibited memory cell of the second group.

12. The memory device as set forth in claim 10 further including a third group of memory cells that are coupled to partial select gate drains that are differently shaped than the partial select gate drains coupled to the memory cells of the second group.

13. The memory device as set forth in claim 12 wherein the selected word line includes at least one uninhibited memory cell of the third group and at least one inhibited memory cell of the third group, and the controller is further configured to;

simultaneous to the application of the programming voltage, apply a different voltage to at least one bit line coupled to the at least one uninhibited memory cell of the third group than the voltages that are applied by the controller to the bit lines coupled to the uninhibited memory cells of the first and second groups, or simultaneous to the application of the programming voltage, apply a different voltage to at least one bit line coupled to the at least one inhibited memory cell of the third group than the voltages that are applied by the controller to the bit lines coupled to the inhibited memory cells of the first and second groups.

14. The memory device as set forth in claim 8 wherein the voltages applied by the controller to the bit lines coupled to memory cells of the first group are equal to the voltages applied by the controller to the bit lines coupled to memory cells of the second group plus a biasing voltage.

15. A memory device, comprising:
    a plurality of memory cells including a first group of memory cells that are coupled to full select gate drains and a second group of memory cells that are coupled to partial select gate drains; and
    a controller configured to perform a plurality of programming loops including verify operations, the controller being further configured to apply a first bit line voltage to a plurality of bit lines coupled to the memory cells of the second group during the verify operation of at least one first programming loop and to apply a second bit line voltage that is greater than the first bit line voltage to the plurality of bit lines coupled to the memory cells of the second group during the verify operation of at least one subsequent programming loop.

16. The memory device as set forth in claim 15 wherein the controller is further configured to apply the second bit line voltage to a plurality of bit lines that are coupled to the memory cells of the first group during the verify operations of the plurality of programming loops.

17. The memory device as set forth in claim 16 wherein the at least one first programming loop is no more than four programming loops.

18. The memory device as set forth in claim 15 wherein the second bit line voltage is at least 0.05 V greater than the first bit line voltage.

19. The memory device as set forth in claim 18 wherein the first bit line voltage is approximately 0.10 V and the second bit line voltage is approximately 0.15 V.

20. The memory device as set forth in claim 15 wherein the partial select gate drains are semi-circular in shape.

* * * * *